(12) United States Patent
Thyagarajan et al.

(10) Patent No.: US 12,278,583 B2
(45) Date of Patent: Apr. 15, 2025

(54) DEEP LEARNING MODELS FOR ELECTRIC MOTOR WINDING TEMPERATURE ESTIMATION AND CONTROL

(71) Applicant: Deere & Company, Moline, IL (US)

(72) Inventors: Lav Thyagarajan, West Fargo, ND (US); Yujiang Wu, Fargo, ND (US); Zhuoyan Xu, Fargo, ND (US); Abram Haich, Moline, IL (US); Jared Lervik, Fargo, ND (US)

(73) Assignee: Deere & Company, Moline, IL (US)

( * ) Notice: Subject to any disclaimer, the term of this patent is extended or adjusted under 35 U.S.C. 154(b) by 211 days.

(21) Appl. No.: 18/048,224

(22) Filed: Oct. 20, 2022

(65) Prior Publication Data

US 2024/0136969 A1  Apr. 25, 2024
US 2024/0235454 A9  Jul. 11, 2024

(51) Int. Cl.
*H02P 29/64* (2016.01)
*G01R 31/34* (2020.01)

(52) U.S. Cl.
CPC ............ *H02P 29/64* (2016.02); *G01R 31/343* (2013.01); *G01R 31/346* (2013.01)

(58) Field of Classification Search
CPC ...... H02P 29/64; G01R 31/343; G01R 31/346
See application file for complete search history.

(56) References Cited

U.S. PATENT DOCUMENTS

| 4,525,763 A * | 6/1985 | Hardy .................. G07C 3/00 361/25 |
| 8,174,222 B2 * | 5/2012 | Patel ................... H02P 29/60 477/3 |

(Continued)

FOREIGN PATENT DOCUMENTS

| CN | 108562854 B | 11/2019 |
| CN | 112242812 A | 1/2021 |

(Continued)

OTHER PUBLICATIONS

Extended European Search Report and Written Opinion issued in European Patent Application No. 23197731.5, dated Mar. 4, 2024, in 12 pages.

(Continued)

*Primary Examiner* — Rina I Duda
(74) *Attorney, Agent, or Firm* — Harness, Dickey & Pierce, P.L.C.

(57) ABSTRACT

A motor control system includes a motor including a plurality of windings, a first sensor configured to sense a first operating parameter of the motor, a second sensor configured to sense a second operating parameter of the motor, and memory hardware configured to store a machine learning model and computer-executable instructions. The machine learning model is trained to generate a winding temperature estimation output based on motor operating parameter inputs. The motor control system includes processor hardware configured to execute the instructions and use the machine learning model to cause the motor control system to generate a winding temperature estimation output using the machine learning model based on the first operating parameter and the second operating parameter, the temperature estimation output indicative of a predicted temperature of the plurality of windings, and control the motor based on the winding temperature estimation output.

20 Claims, 9 Drawing Sheets

(56) References Cited

U.S. PATENT DOCUMENTS

| | | | | |
|---|---|---|---|---|
| 8,482,238 | B2* | 7/2013 | Xie | B60W 10/08 |
| | | | | 318/473 |
| 8,487,575 | B2* | 7/2013 | Yeh | H02P 29/664 |
| | | | | 318/432 |
| 2009/0189561 | A1* | 7/2009 | Patel | H02H 7/0852 |
| | | | | 310/68 C |
| 2011/0050141 | A1* | 3/2011 | Yeh | H02P 29/664 |
| | | | | 318/434 |
| 2015/0048772 | A1* | 2/2015 | Nagata | H02K 11/21 |
| | | | | 318/634 |
| 2021/0112703 | A1 | 4/2021 | Johnson et al. | |
| 2021/0333157 | A1* | 10/2021 | Lee | H01L 23/34 |

FOREIGN PATENT DOCUMENTS

| | | |
|---|---|---|
| CN | 114004164 A | 2/2022 |
| EP | 4358393 A1 | 4/2024 |
| JP | 6850458 B1 | 3/2021 |

OTHER PUBLICATIONS

Dilmi Smail et al., A soft sensor of stator winding temperature prediction for PMSMs based on extreme learning machine, 2022 19th International Multi-Conference on Systems, Signals & Devices (SSD), IEEE, May 6, 2022, pp. 969-975, DOI: 10.1109/SSD54932.2022.9955806, [online], [retrieved on Nov. 28, 2022]. Retrieved from the Internet <URL: https://ieeexplore.ieee.org/stamp/stamp.jsp?tp=&arnumber=9955806>.

Lee Jun et al., Temperature Estimation of PMSM Using a Difference-Estimating Feedforward Neural Network, IEEE Access, IEEE, USA, vol. 8, Jul. 15, 2020, pp. 130855-130865, DOI: 10.1109/ACCESS.2020.3009503, [online], [retrieved on Jul. 23, 2020]. Retrieved from the Internet <URL: https://ieeexplore.ieee.org/stamp/stamp.jsp?arnumber=9141245>.

Jun Li et al., Global Attention-based Encoder-Decoder LSTM Model for Temperature Prediction of Permanent Magnet Synchronous Motors, arxiv.org, Cornell University Library, 201 Olin Library Cornell University Ithaca, NY 14853, Jul. 30, 2022, pp. 1-11.

Baptista Marcia L et al., Relation between prognostics predictor evaluation metrics and local interpretability SHAP values, Artificial Intelligence, Elsevier Science Publisher B.V., Amsterdam, NL, vol. 306, Feb. 15, 2022, pp. 1-22, ISSN: 0004-3702, DOI: 10.1016/J.ARTINT.2022.103667, [retrieved on Feb. 15, 2022].

Wallscheid Oliver et al., Thermal Monitoring of Electric Motors: State-of-the-Art Review and Future Challenges, IEEE Open Journal of Industry Applications, IEEE, vol. 2, Jun. 23, 2021, pp. 204-223, DOI: 10.1109/OJIA.2021.3091870, [online], [retrieved on Jul. 20, 2021]. Retrieved from the Internet <URL: https://ieeexplore.ieee.org/stamp/stamp.jsp?tp=&arnumber=9463739>.

T. Chen et al. "XGBoost: A Scalable Tree Boosting System" KDD '16, Aug. 13-17, 2016, San Francisco, CA, USA.

G. Ke et al. "LightGBM: A Highly Efficient Gradient Boosting Decision Tree" 31st Conference on Neural Information Processing Systems (NIPS 2017), Long Beach, CA, USA.

PMSM with Thermal Model, https://www.mathworks.com/help/sps/ug/pmsm-with-thermal-model.html.

Kirchgässner et al., Deep Residual Convolutional and Recurrent Neural Networks for Temperature Estimation in Permanent Magnet Synchronous Motors, 2019 IEEE International Electric Machines & Drives Conference (IEMDC), May 2019, pp. 1439-1446, doi: 10.1109/IEMDC.2019.8785109.

García-Perez et al., Machine Learning for Inverter-Fed Motors Monitoring and Fault Detection: An Overview, vol. 12, 2024, Feb. 16, 2024, pp. 27167-27179.

Yutthanawa et al., Multi-surface Permanent Magnet Synchronous Motor Temperature Estimation based on Automate Machine Learning Approach, 2023 8th International Conference on Business and Industrial Research (ICBIR2023), May 18-19, 2023, pp. 1051-1055.

Hosseini et al., Deep Neural Network Modeling for Accurate Electric Motor Temperature Prediction, 2022 IEEE Canadian Conference on Electrical and Computer Engineering (CCECE), Sep. 2022, pp. 171-175, DOI: 10.1109/CCECE49351.2022.9918222.

Kirchgässner et al., Empirical Evaluation of Exponentially Weighted Moving Averages for Simple Linear Thermal Modeling of Permanent Magnet Synchronous Machines, 2019 IEEE 28th International Symposium on Industrial Electronics (ISIE), Jun. 2019, pp. 318-323, doi: 10.1109/ISIE.2019.8781195.

Kirchgässner et al., Estimating Electric Motor Temperatures with Deep Residual Machine Learning, IEEE Transactions on Power Electronics, vol. 36, No. 7, Jul. 2021, pp. 7480-7488, doi: 10.1109/TPEL.2020.3045596.

Czerwinski et al., Machine Learning for Sensorless Temperature Estimation of a BLDC Motor, Sensors, vol. 21, No. 14, Jul. 2021, pp. 1-17, doi: 10.3390/s21144655.

Gedlu et al., Permanent magnet synchronous machine temperature estimation using low-order lumped-parameter thermal network with extended iron loss model, 10th International Conference on Power Electronics, Machines and Drives (PEMD 2020), Dec. 2020, pp. 937-942, doi: 10.1049/icp.2021.1017.

Lee et al., Temperature Estimation of PMSM Using a Difference-Estimating Feedforward Neural Network, IEEE Access, vol. 8, Jul. 15, 2020, pp. 130855-130865, doi: 10.1109/ACCESS.2020.3009503.

Electric Motor Temperature, pp. 1, [online]. Retrieved from the Internet <URL: https://www.kaggle.com/datasets/wkirgsn/electric-motor-temperature>.

* cited by examiner

DEEP LEARNING MODELS FOR ELECTRIC MOTOR WINDING TEMPERATURE ESTIMATION AND CONTROL

FIELD

The present disclosure relates to deep learning models for electric motor winding temperature estimation and control.

BACKGROUND

Maintaining acceptable winding temperature is important for safe operation of electric machines, such as electric motors. Premature failure of a winding temperature sensor may cause de-rated operation of the motor, which can lead to decreased performance of a system including the motor.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

A motor control system includes a motor including a plurality of windings, a first sensor configured to sense a first operating parameter of the motor, a second sensor configured to sense a second operating parameter of the motor, and memory hardware configured to store a machine learning model and computer-executable instructions. The machine learning model is trained to generate a winding temperature estimation output based on motor operating parameter inputs. The motor control system includes processor hardware configured to execute the instructions and use the machine learning model to cause the motor control system to generate a winding temperature estimation output using the machine learning model based on the first operating parameter and the second operating parameter, the temperature estimation output indicative of a predicted temperature of the plurality of windings, and control the motor based on the winding temperature estimation output.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings.

DETAILED DESCRIPTION

In some example embodiments, a machine learning model is used to estimate winding temperature of an electrical machine, such as an electrical motor. The estimated winding temperature may be used to maintain safe operation of the motor, to detect decreased performance of the motor, as a redundant sensor to implement fault tolerance and to maintain system performance, etc.

For example, winding temperature sensors may occasionally fail, and may be expensive to replace due to the sensors being located within the motor. Using a machine learning model may allow for estimation of a winding temperature without using temperature sensors in the motor, based on variables of the system such as torque, speed, inlet temperature, flow, etc. In various implementations, a deep learning model may estimate the winding temperature based on one or more of the variables to act as a virtual winding temperature sensor, providing benefits in cost, reliability and overall machine health.

Winding Temperature Estimation System

Figure 1:
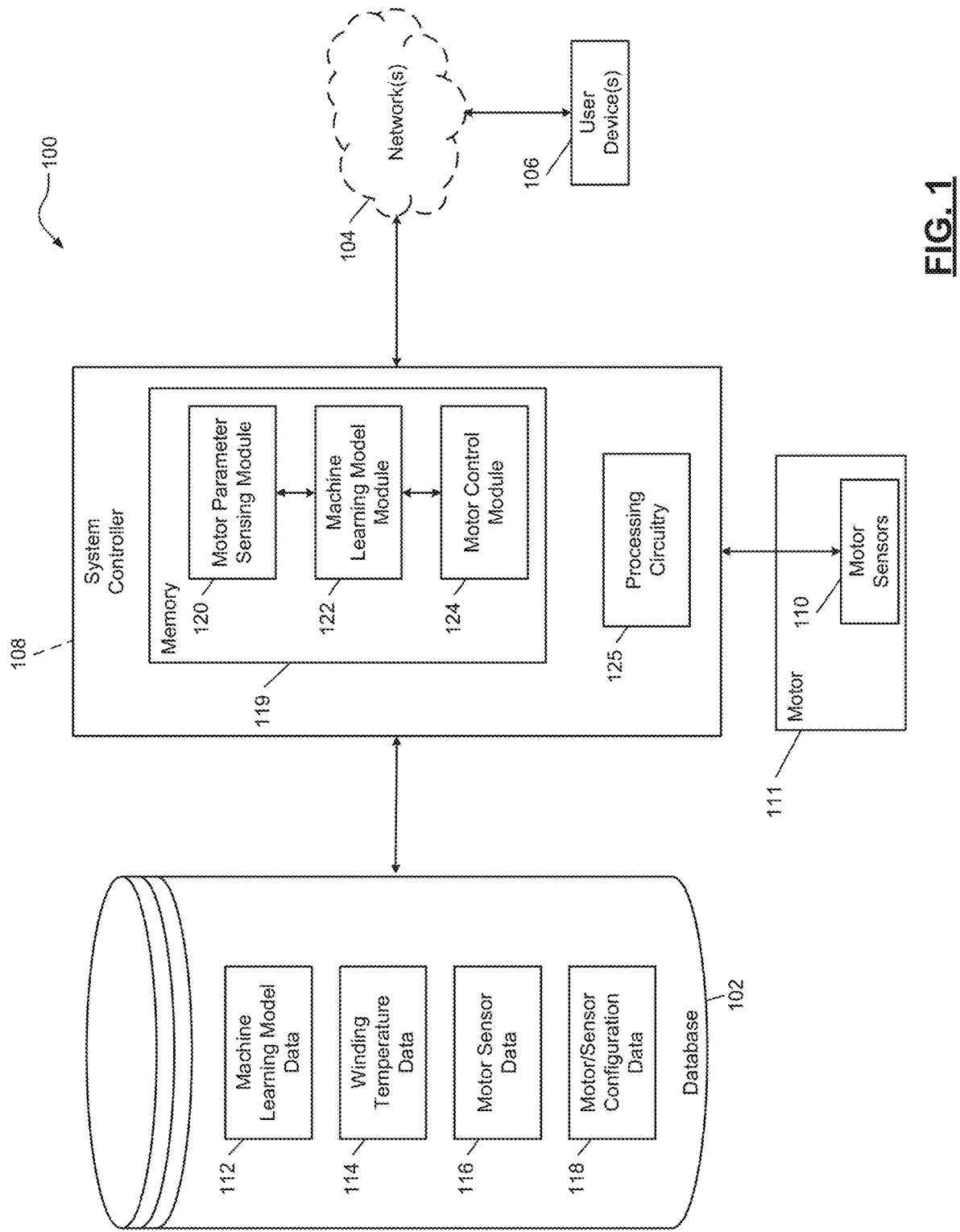
FIG. 1 is a functional block diagram of an example system for estimating winding temperature of an electric motor using a machine learning model.

FIG. 1 is a functional block diagram of an example system 100 for estimating winding temperature of an electric machine (such as an electric motor), using a machine learning model. While the system 100 is generally described as including a database 102 and system controller 108 for implementing the machine learning model, components of the system 100 may otherwise be deployed (for example, as a standalone processor setup). The system 100 may include an integrated circuit, a processor chip, a desktop computer, a laptop computer, a tablet, a smartphone, etc.

As shown in FIG. 1, the database 102 is configured to store machine learning model data 112, winding temperature data 114, motor sensor data 116, and motor/sensor configuration data 118. The machine learning model data 112, winding temperature data 114, motor sensor data 116, and motor/sensor configuration data 118 may be located in different physical memories within the database 102, such as different random access memory (RAM), read-only memory (ROM), a non-volatile hard disk or flash memory, etc. In some implementations, the machine learning model data 112, winding temperature data 114, motor sensor data 116, and motor/sensor configuration data 118 may be located in the same memory (such as in different address ranges of the same memory). In various implementations, the machine learning model data 112, winding temperature data 114, motor sensor data 116, and motor/sensor configuration data 118 may each be stored as structured or unstructured data in any suitable type of data store (e.g., as one or more data structures).

The machine learning model data 112 may include any suitable data for training one or more machine learning models, such as feature vector inputs, historical winding temperature and sensor data, training and testing data for developing a machine learning model, etc. The machine learning model data 112 may be used to train one or more machine learning models to generate a winding temperature estimation output, such as a prediction of an internal winding temperature of an electric motor. Example machine learning models include, but are not limited to, a feed forward network (FFN), a temporal convolution neural network (TCN), a convolution neural network, a long short-term memory (LSTM) network, an XGBoost model, a transformer model, a linear regression model, a decision tree model, a random forest model, a gradient boosting machine (GBM), a recurrent neural network (RNN) or a multilayer perceptron (MLP) model.

In various implementations, users may train a machine learning model by accessing the system controller 108 via the user device 106. The user device 106 may include any suitable user device for displaying text and receiving input from a user, including a desktop computer, a laptop computer, a tablet, a smartphone, etc. In various implementations, the user device 106 may access the database 102 or the system controller 108 directly, or may access the database 102 or the system controller 108 through one or more networks 104. Example networks may include a wireless network, a local area network (LAN), the Internet, a cellular network, etc.

The system controller 108 may include hardware or a combination of hardware and software to execute one or more modules for estimating internal winding temperature of an electric motor based on motor parameters, such as sensed values of the motor sensors 110 associated with the motor 111. For example, FIG. 1 illustrates a motor parameter sensing module 120, a machine learning model module 122, and a motor control module 124. The motor parameter sensing module 120, machine learning model module 122, and motor control module 124 may be stored in a memory 119 of the system controller. The system controller 108 may include processing circuitry 125 for executing one or more of the motor parameter sensing module 120, a machine learning model module 122, and a motor control module 124.

The motor parameter sensing module 120 may be used to obtain motor operating parameters, such as via the motor sensors 110. The obtained motor operating parameters may be processed and stored in the database 102, such as defining a portion of the machine learning model data 112 for training and testing a model, such as the motor sensor data 116 to define current or historical motor sensor data, etc. The obtained motor operating parameters from the motor sensors 110 may be used by the machine learning model module 122 in real-time to generate a current winding temperature estimation output, which may be used by the motor control module 124 to control the motor (such as stopping operation of the motor if the estimated winding temperature exceeds a winding temperature safety threshold).

The machine learning model module 122 may be used to process motor operating parameter data to generate winding temperature estimation outputs. For example, the machine learning model module 122 may implement one or more trained models based on, e.g., the machine learning model data 112, to generate an estimation output regarding an estimated internal winding temperature of an electric motor based on motor operating parameters received via the motor sensors 110 (or other operating parameter detection circuits). The machine learning model module 122 may access any suitable data to supply to a model, such as operating parameters received from the motor sensors 110, operating parameters processed by the motor parameter sensing module 120, the winding temperature data 114, the motor sensor data 116, the motor/sensor configuration data 118, etc.

The motor control module 124 may be used to control operation of the motor based on the winding temperature estimation output from the machine learning model module 122. For example, the motor control module 124 may compare a winding temperature estimation output of the machine learning model module 122 to a winding temperature threshold, to determine whether the motor windings have reached an unsafe temperature, a temperature indicative of a failure of the windings or deterioration of the windings, a temperature indicative of decreased performance of the windings, etc. In response to a winding temperature determination, the motor control module 124 may slow down an operating speed of the motor, turn off the supply of power to the motor, etc.

In some example embodiments, the machine learning model may be used as a virtual temperature sensor that provides backup redundancy when a hardware winding temperature sensor is available (e.g., when a physical temperature sensor is located in the motor windings). Diagnostic information may be provided by the machine learning model to a user, in the event of a hardware sensor failure. Redundancy logic may seamlessly use the winding temperature estimation output of the machine learning model for motor protection and control, which may improve motor uptime without compromising thermally safe operation of the electric machine. Use of the winding temperature estimation output of the machine learning model may allow for torque derating schemes to continue working the same as implementations that do not include the machine learning model.

In various implementations, the motor control module 124 may transmit an estimated winding temperature value to another computing device, store the estimated winding temperature value in memory (such as the winding temperature data 114 of the database 102), display the estimated winding temperature value, etc. Similarly, in response to determining that the estimated winding temperature has exceeded a threshold, the motor control module 124 may generate an alert or notification, and transmit the alert to another computing device, log the alert in memory (such as in the database 102), display the alert, etc.

The winding temperature data 114 may include any suitable data indicating temperature of windings of an electric machine (such as an electric motor). For example, the winding temperature data 114 may include estimated winding temperature based on outputs of the machine learning model module 122, measured historical winding temperatures generated by a temperature sensor of the motor for training a machine learning model, etc.

The motor sensor data 116 may include any suitable data regarding operating parameters of the motor, such as operating parameters that are sensed by the motor sensors 110, operating parameters that are detected or determined by motor detection circuitry, etc. The motor sensor data 116 may include current operating parameters of a motor, or may include historical operating parameters for use in training a machine learning model. Example motor operating parameters include, but are not limited to, an oil inlet temperature, a rotor oil flow, a stator oil flow, a speed of the motor, a torque of the motor, a direct current (DC) bus voltage of the motor, a quadrature(q)-axis voltage of the motor, a direct (d)-axis voltage of the motor, a q-axis current of the motor or a d-axis current of the motor.

The motor/sensor configuration data 118 may include any suitable information about the motor sensors 110 and/or the motor. For example, the motor/sensor configuration data 118 may include information about types of sensors in the system 100, values obtainable by the sensors 110, a type of motor, a type of windings of the motor, expected operation of the motor, etc.

In some example embodiments, the machine learning model may include a neural network model that is trained on synthetic data, which may be generated using, e.g., a Simulink thermal model. An example thermal model may be found at https://www.mathworks.com/help/sps/ug/pmsm-with-thermal-model.html (last visited Oct. 13, 2022), the entire contents of which are hereby incorporated by reference. For example, the thermal model may include a nonlinear model of a permanent magnet synchronous motor (PMSM) with thermal dependency. In various implementations, the PMSM behavior may be defined by tabulated nonlinear flux linkage data. Motor losses may be turned into heat in the stator winding and rotor thermal ports. As an example, the thermal model simulation may allow for plotting motor speed, torque, winding currents, temperatures of motor components, etc., as a control system attempts to track a reference signal. A load torque may be applied to the shaft, and the effect on the system may be shown in the winding currents.

In some example embodiments, the simulation thermal model may be run for a desired amount of time with random speed commands, load torques and ambient temperatures that emulate conditions that an electric machine may be exposed to in real life. The thermal model may be run to generate a desired amount of data representative of a variety of operating regimes of the electric machine. For example, the motor currents, voltages, speed, torque, ambient temperature, etc. may be logged in a Matlab workspace at, e.g., 1 Hz. Time series data may be exported from the workspace for training the machine learning model.

The machine learning model may use inputs including, but not limited to, one or more motor component currents, voltages, torque values, speed values, oil inlet temperatures and oil flow rates. Other suitable motor parameters may also be added as input data to the machine learning model for generating the winding temperature estimation output.

For example, machine currents and voltages may be already available when they are used for standard machine control, such as a quadrature(q)-axis voltage of the motor, a direct(d)-axis voltage of the motor, a q-axis current of the motor or a d-axis current of the motor, which may be obtained from an inverter associated with the motor. Three phase alternating current (AC) current sensors may be available on motor control/power hardware such as an inverter, and control software may perform a Park transformation in control code to convert three phase AC currents to synchronous frame two phase quantities (e.g., the d-axis current and the q-axis current), using measured positions. The d-axis voltage and the q-axis voltage may be commanded voltages that are generated from the d-axis and q-axis closed loop current regulators.

In various implementations, commanded torque or estimated torque, and measured speed (which may be derived from a position sensor), may be already available on motor control/power hardware such as an inverter, for standard machine control. Oil inlet temperature and oil flow information may be provided over a controller area network (CAN) bus to an inverter controller (e.g., from other temperature and flow sensors associated with the motor).

Figure 2:
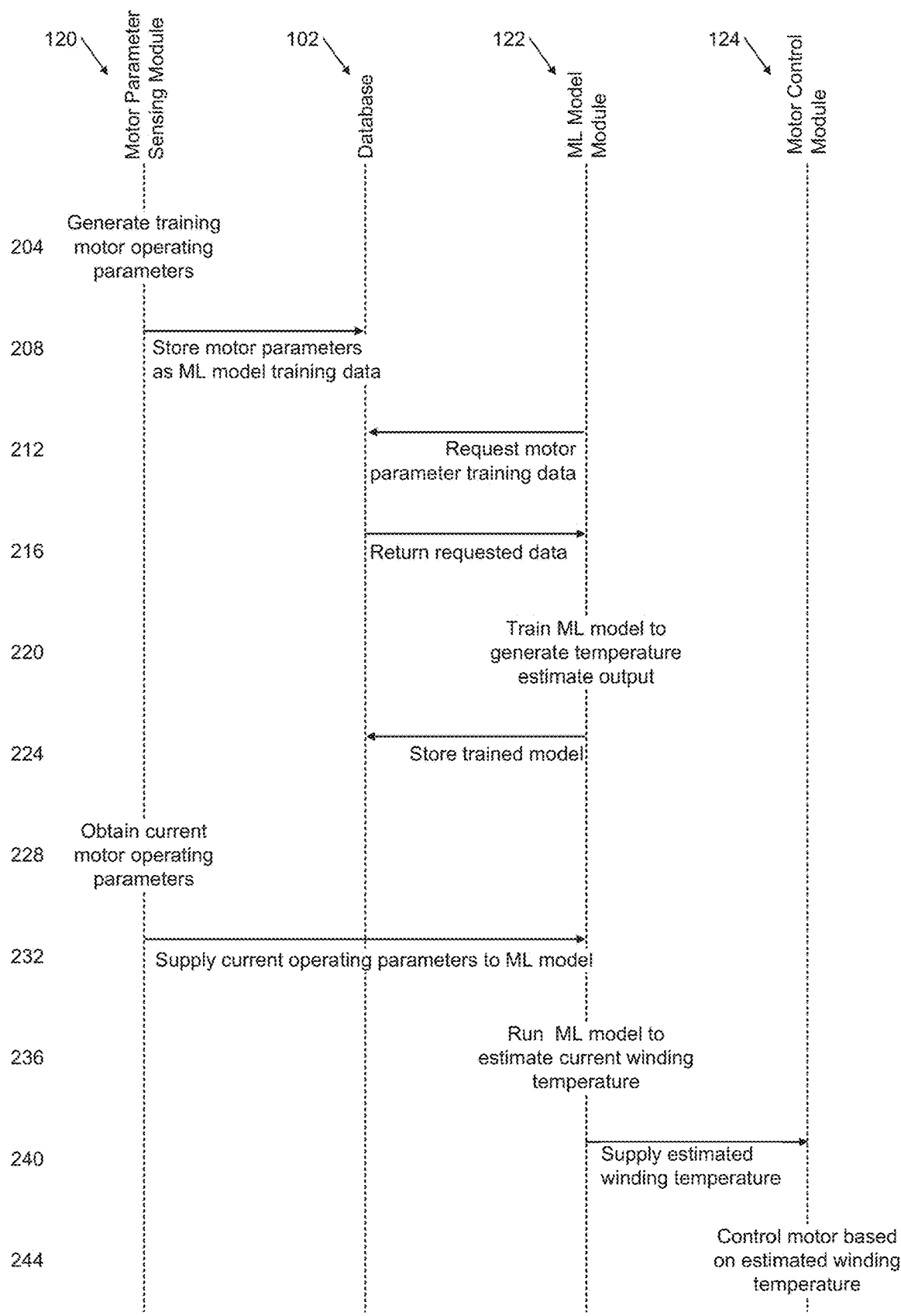
FIG. 2 is a message sequence chart illustrating example interactions between components of the system of FIG. 1.

FIG. 2 is a message sequence chart illustrating example interactions between the database 102, the motor parameter sensing module 120, the machine learning model module 122, and the motor control module 124. At line 204, the motor parameter sensing module 120 generates training motor operating parameters. For example, the motor parameter sensing module may generate synthetic motor operating parameters for training a machine learning model, may obtain historical motor operating parameters, may obtain sensed motor operating parameters during a current motor run to store for later use in machine learning model training, etc. Example motor operating parameters may include parameters that describe a state of operation of at least one aspect of the motor, including but not limited to a torque of the motor, a direct current (DC) bus voltage of the motor, a quadrature(q)-axis voltage of the motor, a direct(d)-axis voltage of the motor, a q-axis current of the motor or a d-axis current of the motor.

In some example embodiments, three phase AC current sensors may be used to obtain motor parameters, such as current sensors available on motor control/power hardware such as an inverter. Control software may convert the three phase AC currents to synchronous frame two phase quantities (e.g., the d-axis current and the q-axis current), using a Park transformation and measured positions. The d-axis voltage and q-axis voltage may be commanded voltages generated from d-axis and q-axis closed loop current regulators. A direct current (DC) bus voltage may be measured, detected, etc., although the DC bus voltage may not be included in implementations where the DS bus voltage does not have a significant effect on winding temperature estimation by the machine learning model.

At 208, the motor operating parameters used for training are stored in the database 102 as machine learning model training data. The machine learning model module 122 then requests the motor parameter training data from the database 102 at 212, which may include, e.g., the machine learning model data 112, the winding temperature data 114, the motor sensor data 116, etc.

The database 102 returns the requested training data to the machine learning model module 121 at line 216, and the machine learning model module 122 trains a machine learning model to generate a winding temperature estimate at 220. Any suitable machine learning model architectures and training methods may be used by the machine learning model module 122, including example implementations described further herein.

In some example embodiments, synthetic training data may be generated from a thermal model of the electric machine in, e.g., a Simulink simulation, by randomizing input data to the thermal model to emulate drive cycles. The machine learning model (which may be any suitable machine learning model architecture such as a neural network model), may then be trained on, e.g., a graphics processing unit (GPU), using the generated synthetic data.

After a selected machine learning model is trained within a desired accuracy, the machine learning model module 122 stores the trained model in the database 102 at line 224, for later use in generating substantially real-time winding temperature estimation outputs. Although FIG. 2 illustrates training a machine learning model by the machine learning model module 122 accessing stored data from a database 102, in other example embodiments the machine learning model may be trained using other suitable approaches.

At line 228, the motor parameter sensing module 120 obtains motor operating parameters for a current operation state of the motor (e.g., the motor 111 of FIG. 1). For example, during a current running of the motor, the motor parameter sensing module 120 may obtain motor operating parameters from the motor sensors 110 to determine values indicative of a current operating state of the motor, may obtain parameters from motor detection circuitry, etc. At line 232, the motor parameter sensing module 120 supplies the current operating parameters to the machine learning model module 122.

The machine learning model module 122 runs the machine learning model to estimate a current winding temperature at line 236. For example, the machine learning model module 122 may supply the current motor operating parameters received from the motor parameter sensing module 120 as input to the trained machine learning model that was stored in the database 102 at line 224.

At line 240, the machine learning model module 122 supplies the winding temperature estimation output to the motor control module 124. For example, the machine learning model module may supply the winding temperature estimation output to the motor control module 124, for the motor control module 124 to compare the estimation output to one or more temperature thresholds.

The motor control module 124 controls the motor based on the estimated winding temperature, at line 244. For example, if the estimated winding temperature received from the machine learning model module 122 is less than a specified temperature threshold, the motor control module 124 may continue normal operation of the motor. If the estimated winding temperature exceeds the specified temperature threshold, the motor control module 124 may reduce power supplied to the windings, shut off power to the windings, reduce a speed setting of the motor, etc. In various implementations, the motor control module 124 (or another module) may generate a notification or alert that is transmitted to another computing device, to a system administrator, etc., indicating that the winding temperature has exceeded the specified temperature threshold, and motor maintenance may be desired.

Figure 3:
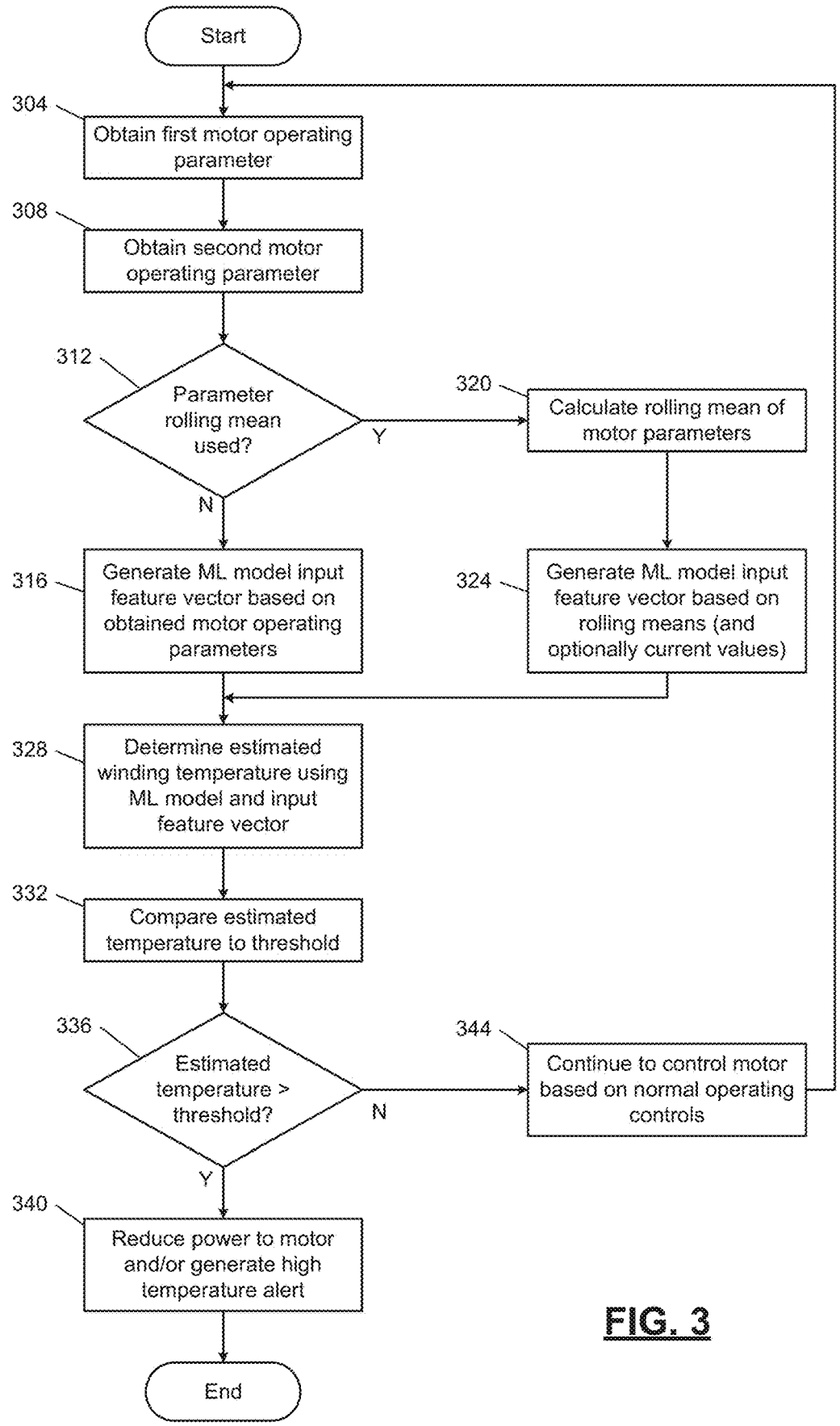
FIG. 3 is a flowchart depicting an example process for estimating winding temperature of an electric motor using a machine learning model.

FIG. 3 is a flowchart depicting an example process for generating a winding temperature estimate for an electric motor using a machine learning model. The method of FIG. 3 may be performed by the controller 108. Control begins at 304 by obtaining a first motor operating parameter. The first motor operating parameter may be sensed by a motor sensor 110, detected by a motor detection circuit, etc.

At 308, the controller 108 obtains a second motor operating parameter, which is different than the first motor operating parameter. Although FIG. 3 illustrates obtaining at least two motor operating parameters (which may optionally be obtained via physical motor sensors 110), in other embodiments any suitable number of motor operating parameters may be obtained. Each parameter may be sensed by a physical sensor, may be detected by a circuit, may be calculated based on other values, etc. For example, in various implementations the model may use ten operating parameters or more as inputs to generate the winding temperature estimation output. Example motor operating parameters include, but are not limited to, an oil inlet temperature, a rotor oil flow, a stator oil flow, a speed of the motor, a torque of the motor, a direct current (DC) bus voltage of the motor, a quadrature(q)-axis voltage of the motor, a direct(d)-axis voltage of the motor, a q-axis current of the motor or a d-axis current of the motor.

In one example implementation, the inputs to the model are a d-axis current of the motor, a q-axis current of the motor, a d-axis voltage of the motor, a q-axis voltage of the motor, a torque of the motor, a speed of the motor, a rolling mean of the d-axis current at a buffer size of 64 (e.g., 64 seconds of data), a rolling mean of the q-axis current at a buffer size of 64, a rolling mean of the d-axis voltage at a buffer size of 64, a rolling mean of the motor torque at a buffer size of 64, a rolling mean of the motor speed at a buffer size of 64, a rolling mean of the stator flow at a buffer size of 64, a rolling mean of the oil temperature at a buffer size of 64, a rolling mean of the d-axis current at a buffer size of 32 (e.g., 32 seconds of data), a rolling mean of the q-axis current at a buffer size of 32, a rolling mean of the d-axis voltage at a buffer size of 32, a rolling mean of the q-axis voltage at a buffer size of 32, a rolling mean of the motor torque at a buffer size of 32, a rolling mean of the motor speed at a buffer size of 32, and a rolling mean of the oil temperature at a buffer size of 32. In this example, the input includes twenty variables, and buffer sizes of 64 seconds of data and 32 seconds of data are used to calculate mean sliding windows.

At 312, the controller 108 determines whether rolling means are being used to generate inputs for the machine learning model. For example, some implementations may use a rolling mean of at least a portion (or all) of the motor operating parameters within a time window, as inputs for the machine learning model.

If the controller 108 determines at 312 that rolling parameters will not be used for input to the machine learning model, control proceeds to 316 to generate a machine learning model input feature vector based on the obtained motor operating parameters. If the controller 108 determines at 312 that rolling parameters will be used for at least a portion of the motor operating parameters, control calculates a rolling mean of specified motor operating parameters over a specified time window at 320.

The controller 108 then generates a machine learning model input feature vector based on the rolling means for each specified motor operating parameter, at 324. As shown in FIG. 3, control may optionally combine current motor operating parameter values with the calculated rolling means of the motor operating parameters, to generate an input feature vector for the machine learning model having both rolling mean values and current sensed values.

At 328, the controller 108 determines an estimated winding temperature using the machine learning model and the input vector. For example, the machine learning model module 122 may run a trained machine learning model on the obtained motor operating parameters to generate a winding temperature estimation output.

At 332, the controller 108 compares the estimated temperature to a specified temperature threshold. For example, the specified temperature threshold may be an internal winding temperature indicative a failure of a winding, decreased performance of a winding, a safety hazard for operating the motor, etc.

If the controller 108 determines at 336 that the estimated winding temperature from the machine learning model is below the specified threshold, control proceeds to 344 to continue normal motor control based on normal motor operating conditions. Control then returns to 304 and 308 to obtain first and second motor operating parameters.

If the controller 108 determines at 336 that the estimated temperature is above the specified threshold, control proceeds to 340 to reduce power to the motor, generate a high temperature alert, etc. For example, control may reduce power to the motor to reduce a temperature of the windings, may reduce an operating speed of the motor to reduce the temperature, may shut off power to the windings completely, etc. The high temperature alert may be stored in a log, transmitted to another computing device to alert an administrator, displayed on a user interface, etc.

In some example embodiments, the system 100 may include processor hardware configured to execute instructions and use a machine learning model to cause the motor control system to generate a winding temperature estimation output based on a plurality of motor operating parameters, the plurality of motor operating parameters including at least two of an oil inlet temperature, a rotor oil flow, a stator oil flow, a speed of the motor, a torque of the motor, a direct current (DC) bus voltage of the motor, a quadrature(q)-axis voltage of the motor, a direct(d)-axis voltage of the motor, a q-axis current of the motor or a d-axis current of the motor, the first operating parameter and the second operating parameter being part of the plurality of operating parameters. In other features, the plurality of motor operating parameters does not include a sensed temperature of the motor or a sensed temperature of the plurality of windings.

In various implementations, the system includes a temperature sensor configured to sense a temperature of the plurality of windings, wherein the instructions further include using the sensed winding temperature from the temperature sensor to control operation of the motor when the temperature sensor has a normal operating condition, and using the winding temperature estimation output to control operation of the motor in response to a failure of the temperature sensor. In other features, the processor hardware may be configured to execute the instructions to cause the motor control system to compare the winding temperature estimation output of the machine learning model to a winding temperature threshold, and transmit an alarm signal in response to the winding temperature estimation output exceeding the winding temperature threshold.

In various implementations, the first sensor includes at least one of an oil temperature sensor, an oil flow sensor, a current sensor or a voltage sensor. In other features, the machine learning model includes at least one of a feed forward network (FFN), a temporal convolution neural network (TCN), a convolution neural network, a long short-term memory (LSTM) network, an XGBoost model, a transformer model, a linear regression model, a decision tree model, a random forest model, a gradient boosting machine (GBM), a recurrent neural network (RNN) or a multilayer perceptron (MLP) model. In other features, the machine learning model is the multilayer perceptron (MLP) model.

In some example embodiments, the processor hardware is configured to execute the instructions to cause the motor control system to determine a rolling mean of the first operating parameter over a specified time period, and supply the determined rolling mean of the first operating parameter as an input to the machine learning model to generate the winding temperature estimation output. In other features, the processor hardware is configured to execute the instructions to cause the motor control system to generate at least one of a shaft torque estimation output indicative of a predicted torque of a shaft of the rotor, and an insulated-gate bipolar transistor (IGBT) temperature estimation output indicative of a predicted temperature of an IGBT of the motor.

In another example embodiment, a computer system includes memory hardware configured to store a machine learning model, motor operating parameter vector inputs, and computer-executable instructions, each motor operating parameter vector input including at least one operating parameter of a motor having a plurality of windings, and processor hardware configured to execute the instructions. The instructions include training the machine learning model with the motor operating parameter vector inputs to generate a winding temperature estimation output, the winding temperature estimation output indicative of a predicted temperature of the plurality of windings based on a plurality of operating parameters of the motor, obtaining a first operating parameter of the motor via a first sensor, obtaining a second operating parameter of the motor via a second sensor, supplying the first operating parameter and the second operating parameter as inputs to the machine learning model to generate the winding temperature estimation output indicative of the predicted temperature of the plurality of windings, and executing at least one control instruction based on the winding temperature estimation output to control operation of the motor.

In various implementations, the instructions further include generating synthetic data to define the motor operating parameter vector inputs for training the machine learning model, wherein generating the synthetic data includes generating timestamp data values for multiple motor operating parameters at multiple points of time within a specified time period, scaling the timestamp data values to normalized input vector values, and for each of the multiple motor operating parameters, determining at least one of a mean, a standard deviation and a rolling average of the normalized input vector values corresponding to the motor operating parameter, wherein the at least one of the mean, the standard deviation and the rolling average is determined within a specified time window size, and a same specified time window size is applied to each of the multiple motor operating parameters.

In various implementations, the machine learning model includes at least one of a feed forward network (FFN), a temporal convolution neural network (TCN), a convolution neural network, a long short-term memory (LSTM) network, an XGBoost model, a transformer model, a linear regression model, a decision tree model, a random forest model, a gradient boosting machine (GBM), a recurrent neural network (RNN) or a multilayer perceptron (MLP) model. In other features, the machine learning model is the multilayer perceptron (MLP) model.

In some example embodiments, supplying inputs to the machine learning model includes supplying a plurality of motor operating parameters to the machine learning model including the first operating parameter and the second operating parameter, and the plurality of operating parameters includes at least one of an oil inlet temperature, a rotor oil flow, a stator oil flow, a speed of the motor, a torque of the motor, a direct current (DC) bus voltage of the motor, a q-axis voltage of the motor, a d-axis voltage of the motor, a q-axis current of the motor or a d-axis current of the motor. In other features, the plurality of motor operating parameters does not include a sensed temperature of the motor or a sensed temperature of the plurality of windings.

In various implementations, the instructions further include determining a rolling mean of the first operating parameter over a specified time period, and supplying the inputs to the machine learning model includes supplying the determined rolling mean of the first operating parameter as an input to the machine learning model to generate the winding temperature estimation output. In other features, executing the control instruction includes comparing the winding temperature estimation output of the machine learning model to a winding temperature threshold, and transmitting an alarm signal in response to the winding temperature estimation output exceeding the winding temperature threshold. In other features, the instructions further include supplying the supplying the first operating parameter and the second operating parameter as inputs to the machine learning model to generate at least one of a shaft torque estimation output indicative of a predicted torque of a shaft of the rotor, and an insulated-gate bipolar transistor (IGBT) temperature estimation output indicative of a predicted temperature of an IGBT of the motor.

Machine Learning Models

Figure 4A:
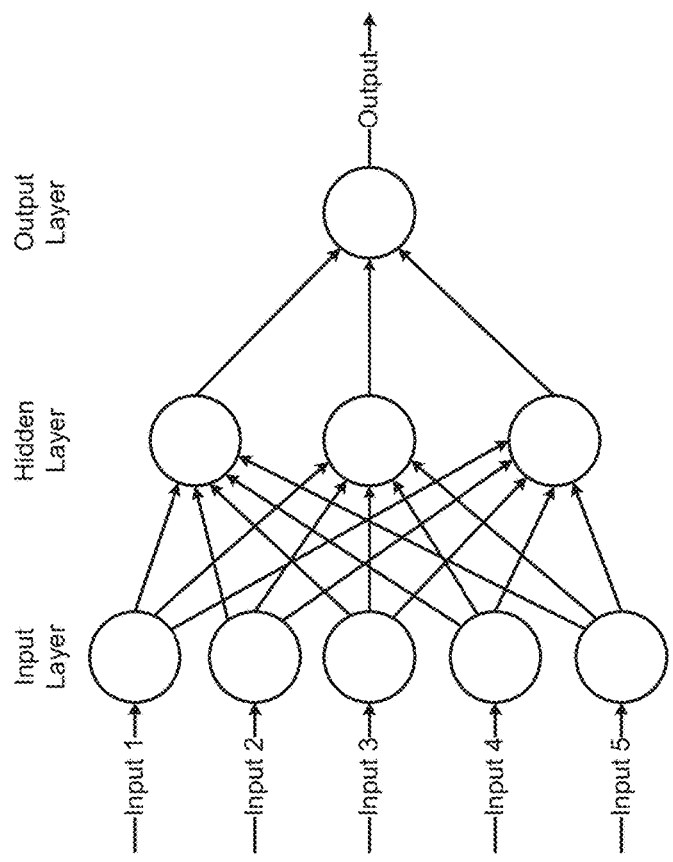
FIGS. 4A and 4B are graphical representations of example recurrent neural networks for generating machine learning models for estimating winding temperature of an electric motor.
Figure 4B:
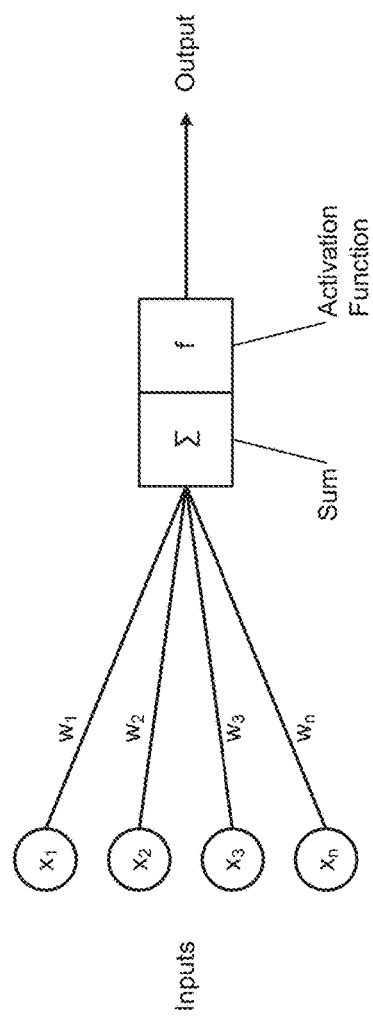

FIGS. 4A and 4B show an example embodiment of a recurrent neural network, which may be used as one optional machine learning model to generate a winding temperature estimation output. Machine learning is a method used to devise complex models and algorithms that lend themselves to prediction (for example, health plan customer predictions). The models generated using machine learning, such as those described above, can produce reliable, repeatable decisions and results, and uncover hidden insights through learning from historical relationships and trends in the data.

The purpose of using the recurrent neural-network-based model, and training the model using machine learning as described above, may be to directly predict dependent variables without casting relationships between the variables into mathematical form. The neural network model includes a large number of virtual neurons operating in parallel and arranged in layers. The first layer is the input layer and receives raw input data. Each successive layer modifies outputs from a preceding layer and sends them to a next layer. The last layer is the output layer and produces output of the system.

FIG. 4A shows a fully connected neural network, where each neuron in a given layer is connected to each neuron in a next layer. In the input layer, each input node is associated with a numerical value, which can be any real number. In each layer, each connection that departs from an input node has a weight associated with it, which can also be any real number (see FIG. 4B). In the input layer, the number of neurons equals number of features (columns) in a dataset. The output layer may have multiple continuous outputs.

The layers between the input and output layers are hidden layers. The number of hidden layers can be one or more (one hidden layer may be sufficient for most applications). A neural network with no hidden layers can represent linear separable functions or decisions. A neural network with one hidden layer can perform continuous mapping from one finite space to another. A neural network with two hidden layers can approximate any smooth mapping to any accuracy.

The number of neurons can be optimized. At the beginning of training, a network configuration is more likely to have excess nodes. Some of the nodes may be removed from the network during training that would not noticeably affect network performance. For example, nodes with weights approaching zero after training can be removed (this process is called pruning). The number of neurons can cause underfitting (inability to adequately capture signals in dataset) or over-fitting (insufficient information to train all neurons; network performs well on training dataset but not on test dataset).

Various methods and criteria can be used to measure performance of a neural network model. For example, root mean squared error (RMSE) measures the average distance between observed values and model predictions. Coefficient of Determination ($R^2$) measures correlation (not accuracy) between observed and predicted outcomes. This method may not be reliable if the data has a large variance. Other performance measures include irreducible noise, model bias, and model variance. A high model bias for a model indicates that the model is not able to capture true relationship between predictors and the outcome. Model variance may indicate whether a model is stable (a slight perturbation in the data will significantly change the model fit).

Figure 5:
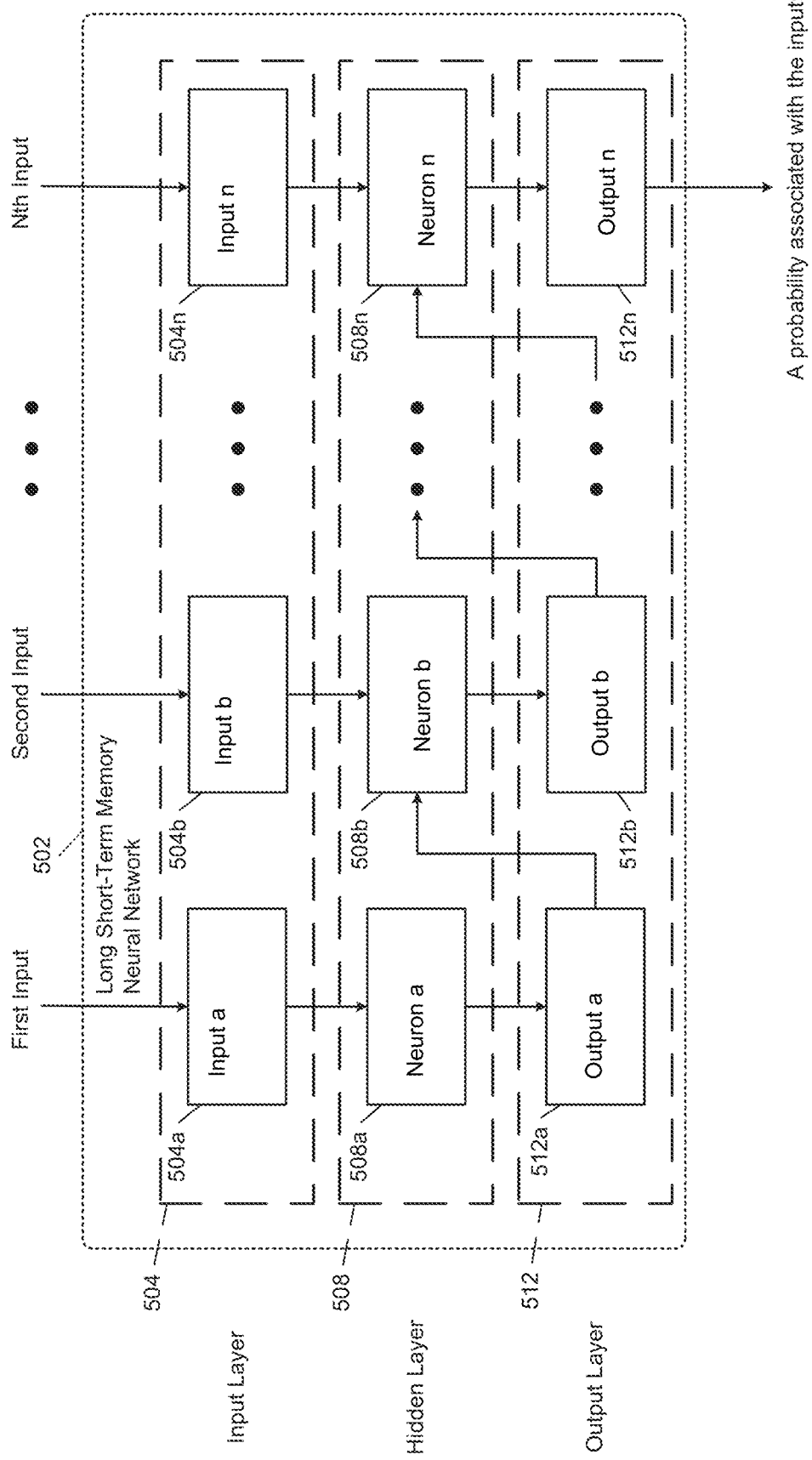
FIG. 5 is a graphical representation of layers of an example long short-term memory (LSTM) machine learning model.

FIG. 5 illustrates an example of a long short-term memory (LSTM) neural network, which may be used as another optional machine learning model to generate a winding temperature estimation output. FIG. 5 is a functional block diagram of a generic example LSTM neural network 502. The generic example LSTM neural network 502 may be used to implement a machine learning model, and various implementations may use other types of machine learning networks. The LSTM neural network 502 includes an input layer 504, a hidden layer 508, and an output layer 512. The input layer 504 includes inputs 504a, 504b . . . 504n. The hidden layer 508 includes neurons 508a, 508b . . . 508n. The output layer 512 includes outputs 512a, 512b . . . 512n.

Each neuron of the hidden layer 508 receives an input from the input layer 504 and outputs a value to the corresponding output in the output layer 512. For example, the neuron 508a receives an input from the input 504a and outputs a value to the output 512a. Each neuron, other than the neuron 508a, also receives an output of a previous neuron as an input. For example, the neuron 508b receives inputs from the input 504b and the output 512a. In this way the output of each neuron is fed forward to the next neuron in the hidden layer 508. The last output 512n in the output layer 512 outputs a probability associated with the inputs 504a-504n. Although the input layer 504, the hidden layer 508, and the output layer 512 are depicted as each including three elements, each layer may contain any number of elements.

In various implementations, each layer of the LSTM neural network 502 must include the same number of elements as each of the other layers of the LSTM neural network 502. In some example embodiments, a convolutional neural network may be implemented. Similar to LSTM neural networks, convolutional neural networks include an input layer, a hidden layer, and an output layer. However, in a convolutional neural network, the output layer includes one fewer output than the number of neurons in the hidden layer and each neuron is connected to each output. Additionally, each input in the input layer is connected to each neuron in the hidden layer. In other words, input 504a is connected to each of neurons 508a, 508b . . . 508n.

In various implementations, each input node in the input layer may be associated with a numerical value, which can be any real number. In each layer, each connection that departs from an input node has a weight associated with it, which can also be any real number. In the input layer, the number of neurons equals number of features (columns) in a dataset. The output layer may have multiple continuous outputs.

As mentioned above, the layers between the input and output layers are hidden layers. The number of hidden layers can be one or more (one hidden layer may be sufficient for many applications). A neural network with no hidden layers can represent linear separable functions or decisions. A neural network with one hidden layer can perform continuous mapping from one finite space to another. A neural network with two hidden layers can approximate any smooth mapping to any accuracy.

Figure 6:
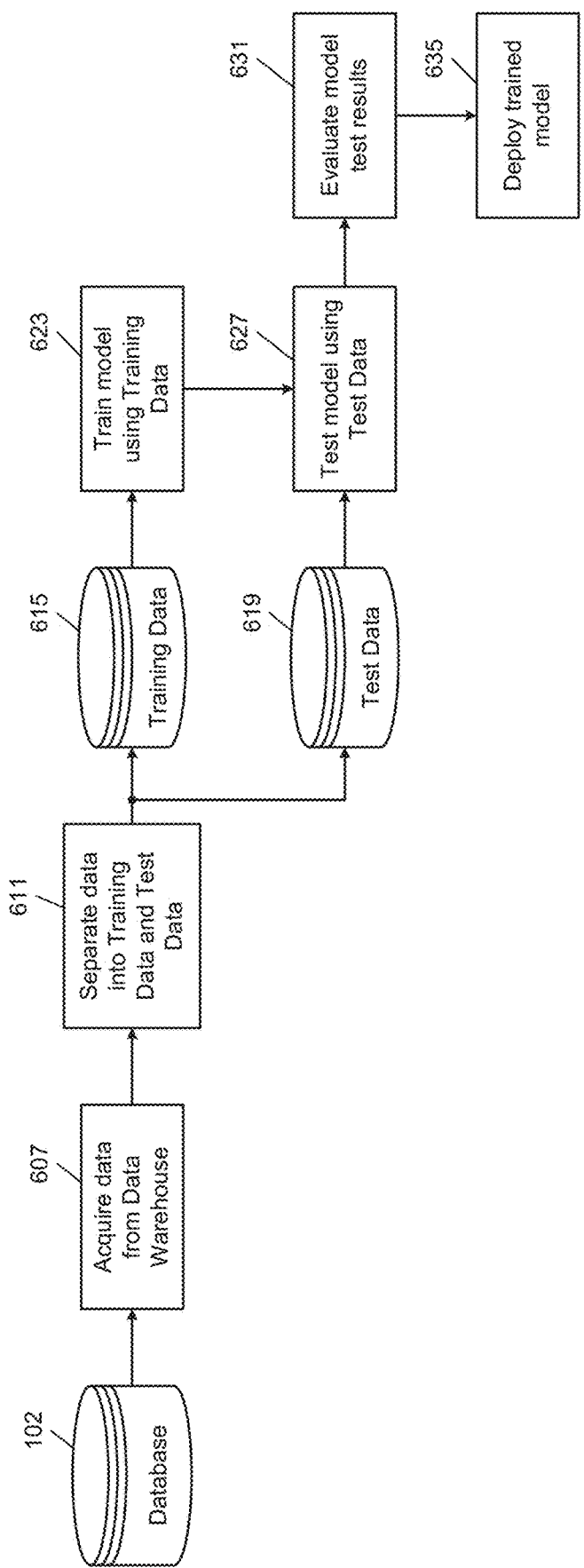
FIG. 6 is a flowchart illustrating an example process for training a machine learning model.

FIG. 6 illustrates an example process for generating a machine learning model (for example, using the machine learning model module 122 of FIG. 1). At 607, control obtains data from a data warehouse, such as the database 102. The data may include any suitable data for developing machine learning models. For example, the machine learning model data 112 from the database 102 may be used as inputs for training the machine learning model.

At 611, control separates the data obtained from the database 102 into training data 615 and test data 619. The training data 615 is used to train the model at 623, and the test data 619 is used to test the model at 627. Typically, the set of training data 615 is selected to be larger than the set of test data 619, depending on the desired model development parameters. For example, the training data 615 may include about seventy percent of the data acquired from the database 102, about eighty percent of the data, about ninety percent, etc. The remaining thirty percent, twenty percent, or ten percent, is then used as the test data 619.

Separating a portion of the acquired data as test data 619 allows for testing of the trained model against actual output data, to facilitate more accurate training and development of the model at 623 and 627. The model may be trained at 623 using any suitable machine learning model techniques, including those described herein, such as random forest, generalized linear models, decision tree, and neural networks.

At 631, control evaluates the model test results. For example, the trained model may be tested at 627 using the test data 619, and the results of the output data from the tested model may be compared to actual outputs of the test data 619, to determine a level of accuracy. The model results may be evaluated using any suitable machine learning model analysis, such as the example techniques described further below.

After evaluating the model test results at 631, the model may be deployed at 635 if the model test results are satisfactory. Deploying the model may include using the model to make predictions for a large-scale input dataset with unknown outputs. If the evaluation of the model test results at 631 is unsatisfactory, the model may be developed further using different parameters, using different modeling techniques, using other model types, etc.

In an example embodiment, a computerized method includes obtaining motor operating parameter vector inputs, each motor operating parameter vector input including at least one operating parameter of a motor having a stator, a rotor, and a plurality of windings, the rotor configured to rotate relative to the stator, and the plurality of windings wound about a portion of at least one of the stator and the rotor, and training a machine learning model with the motor operating parameter vector inputs to generate a winding temperature estimation output, the winding temperature estimation output indicative of a predicted temperature of the plurality of windings based on a plurality of operating parameters of the motor. The method includes obtaining a first operating parameter of the motor via a first sensor, obtaining a second operating parameter of the motor via a second sensor, supplying the first operating parameter and the second operating parameter as inputs to the machine learning model to generate the winding temperature estimation output indicative of the predicted temperature of the plurality of windings, and executing at least one control instruction based on the winding temperature estimation output to control operation of the motor.

Figure 7:
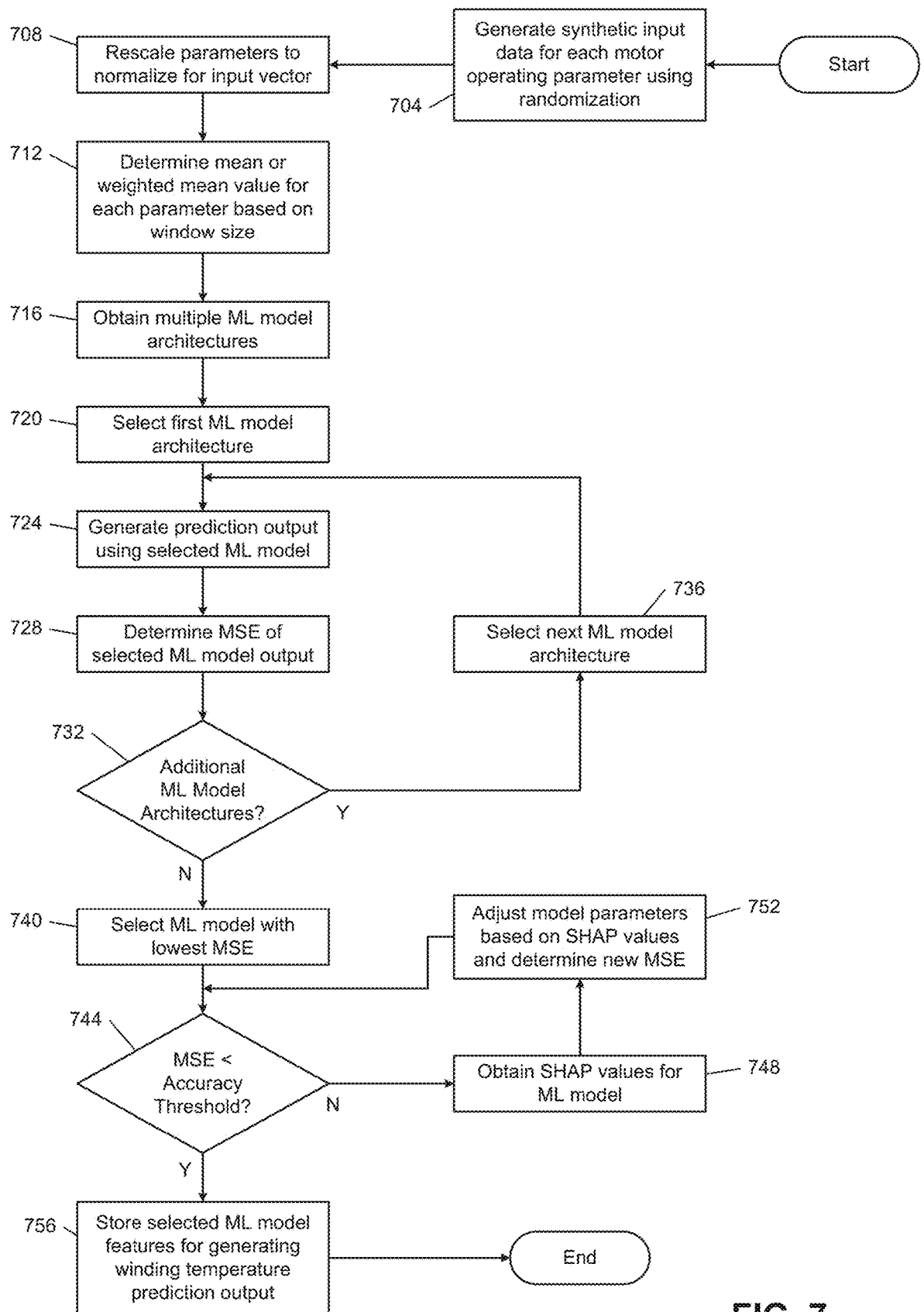
FIG. 7 is a flowchart depicting an example process for generating synthetic data to train a machine learning model to estimate winding temperature of an electric motor.

FIG. 7 is a flowchart depicting an example process for training a machine learning model to generate winding temperature estimation outputs, which may be performed by the system controller 108. For example, the process of FIG. 7 may be performed by the machine learning model module 122 of the controller 108. At 704, control begins by generating synthetic input data for one or more motor operating parameters. Generating synthetic may be optional. For example, in some implementations there may be enough historical data for motor operating parameters and corresponding winding temperatures to train the model based on sensed historic motor operating parameters, or a system may be arranged to sense actual motor operating parameters during different experimental conditions to generate training data.

In situations where there is not sufficient historical data or time to generate experimental motor run data, synthetic data may be generated to train the model. In various implementations, synthetic data may also be generated as a supplement to exiting historical motor data or experimental data in order to improve model training.

In various implementations, software may be used to generate synthetic input data for training using input randomization. For example, Python may be used to generate synthetic data via a MATLAB engine application programming interface (API), for a MATLAB simulation to perform input randomization (e.g., using Simulink). In some example embodiments, such an arrangement may generate the synthetic input data faster (e.g., by generating 1000 seconds of input data or more in sixty seconds of wall clock time), may provide a high data compression (e.g., a compression ratio of 180:1 or more), may use JavaScript object notation (JSON) for data versioning, etc.

In an example embodiment, synthetic model training data may be generated for input variables (e.g., a quadrature(q)-axis voltage of the motor, a direct(d)-axis voltage of the motor, a q-axis current of the motor or a d-axis current of the motor, a DC bus voltage, a motor torque, a motor speed, a stator oil flow, a rotor oil flow, and an oil inlet temperature), and/or for output variables (such as the motor winding temperature). It may be desirable to train models that do not use buffer sizes which are too large, do not require future parameter values to estimate current winding temperature, and do not have too large of a size to implement (e.g., take up too much memory on a motor controller).

At 708, the controller 108 rescales the parameters to normalize the parameters for generating an input vector. For example, at each time stamp one or more of the parameters may be rescaled to have a value that is between zero and one, in order to generate an input vector for the machine learning model.

The controller 108 may optionally determine a mean or weighted mean value for one or more motor operating parameters at 712, and each mean or weighted mean value may be determined based on a specified window size. For example, summary statistics may be calculated for a motor operating parameter for k timesteps in the past (e.g., a window size of k seconds), where k may be any suitable number such as 250, 128, 64, etc. Summary statistics may be generated for a parameter mean over the window size, for a parameter standard deviation over the window size, for a parameter minimum over the window size, for a parameter maximum over the window size, an exponentially weighted moving average (EWMA) over the window size, etc.

In various implementations, multiple feature summary statistics may be combined for a parameter for more recent history time periods (e.g., shorter time windows). For example, control may obtain a mean operating parameter over that last 64 seconds, over the last 32 seconds, over the last 16 seconds, and over the last 8 seconds. These values may be combined to define an input feature vector, which may include a combination of current motor operating parameters and summarized historical parameter values over a specified time window.

The controller 108 obtains multiple machine learning models at 716. For example, multiple machine learning models may be trained and tested to determine which type of model produces the most accurate estimation of winding temperature. Example machine learning models may include, but are not limited to, a feed forward network (FFN), a temporal convolution neural network (TCN), a convolution neural network, a long short-term memory (LSTM) network, an XGBoost model, a transformer model, a linear regression model, a decision tree model, a random forest model, a gradient boosting machine (GBM), a recurrent neural network (RNN) or a multilayer perceptron (MLP) model.

At 720, the controller 108 selects a first machine learning model architecture. Control then generates a winding temperature estimation output using the selected machine learning model at 724. At 728, control determines a mean squared error (MSE) of the selected model, such as by comparing an estimation output winding temperature with an actual winding temperature in training data.

At 732, the controller 108 determines whether any additional machine learning models remain for comparison of model architecture accuracy. If so, control proceeds to 736 to select a next machine learning model architecture, and returns to 724 to generate an estimation output using the next selected machine learning model architecture.

Once all selected machine learning model types have been tested at 732, the controller 108 selects that machine learning model architecture having the lowest MSE value at 740. In one example implementation, MSE values for multiple models may include an MSE of 189 for a linear regression model, an MSE of 207 for a decision tree model, an MSE of 175 for a random forest model, an MSE of 419 for a gradient boosting machine (GBM) model, an MSE of 132 for an XGBoost model, and MSE of 86 for a light GBM model, an MSE of 56 for a multilayer perceptron (MLP) model, an MSE of 361 for an RNN model, and an MSE of 152 for an LSTM with dropout model. In this example, control may select the MLP model as having the lowest MSE value. The MLP model may have a small size (e.g., approximately 2.2 kB), and may be easy to deploy on hardware such as a motor controller.

The controller 108 then determines whether the MSE value is less than an accuracy threshold at 744. For example, a desired accuracy threshold may be specified indicating a level of temperature estimation error that is acceptable for a trained model (e.g., a threshold the MSE value should be lower than in order to indicate a sufficiently trained model).

If the MSE value is not lower than the specified accuracy threshold, control proceeds to 748 to obtain Shapley Additive Explanation (SHAP) values for the model. SHAP values use a game theoretic approach to explain the output of a machine learning model. The SHAP values may illustrate a contribution of each individual input parameter to the overall estimation output of the model (e.g., winding_temp=x*speed+y*torque+ . . . ). For example, in one implementation a rolling mean of the voltage of the q-axis of the motor may have a strongest impact on the temperature estimation output, a stator flow may have a second strongest impact on the temperature estimation output, a rolling mean of the oil temperature may have a third strongest impact on the temperature estimation output, etc.

The controller 108 then uses the SHAP values to adjust model parameters and determine a new MSE for the adjusted parameter machine learning model at 752, and checks whether the adjusted model MSE is below the accuracy threshold. When control determines at 744 that the MSE value of the model is below the accuracy threshold, control proceeds to 756 to store the selected machine learning model and its tuned feature or parameter settings (e.g., as the machine learning model data 112 in the database 102). The stored, tuned model may then be used in the future to generate winding temperature estimation outputs for current operating motor parameters.

In an example embodiment, an MLP model structure may be selected along with a limited feature selection to reduce the input size, such as two previous mean window sizes (e.g., at 64 seconds prior and 32 seconds prior). This may facilitate a small total model size, such as 2.23 kB or less. A suitable buffer size may be selected (e.g., 64 floating points per variable), resulting in a total size of 2.25 kB, and total RAM needed may be less than 5 kB.

In various implementations, an MLP model (or other model) may be coded in a specific programming language on a microcontroller such as a motor operation controller (e.g., the system controller 108). For example, an MLP model may be coded in C programming language on the microcontroller, with weight and bias values loaded into the MLP (e.g., where the weight and bias values were developed during training of the model using Pytorch). The MLP architecture may be constructed in C, and the weight and bias values may be converted into arrays in a C source file. Data may then be supplied to the MLP model in C, and the MLP model in Pytorch, to compare the output. If the MLP model in C has the same or substantially the same output as the MLP model in Pytorch, the C code model may be deployed on a motor controller.

Cynet is a package that can be invoked in Python, developed by Abram. The Cynet package may construct the MLP model in C, and be loaded with the trained weight and bias values. The output of the MLP model in C may be tested using, e.g., the following lines of code in python (import cynet; cynet.forward(input)).

Any suitable model validation may be performed, such as software-in-the-loop (SIL) validation, processor-in-the-loop (PIL) validation, etc. In various implementations, PIL validation may include using a controller area network (CAN) interface (such as a JOHN DEERE PD400 inverter CAN interface), an OPAL real-time simulation CPU, an Ethernet TCP/IP connection, etc.

Lab testing may be performed to check operation of the trained model. In an example embodiment, a test condition may include a DC voltage of 750V, a stator oil flow of 18 L/min, and an oil inlet temperature of forty degrees Celsius, where the electric machine is a SCHAEFFLER 240 SF eMachine for an F10 tractor.

Motor Operating Parameters

Figure 8:
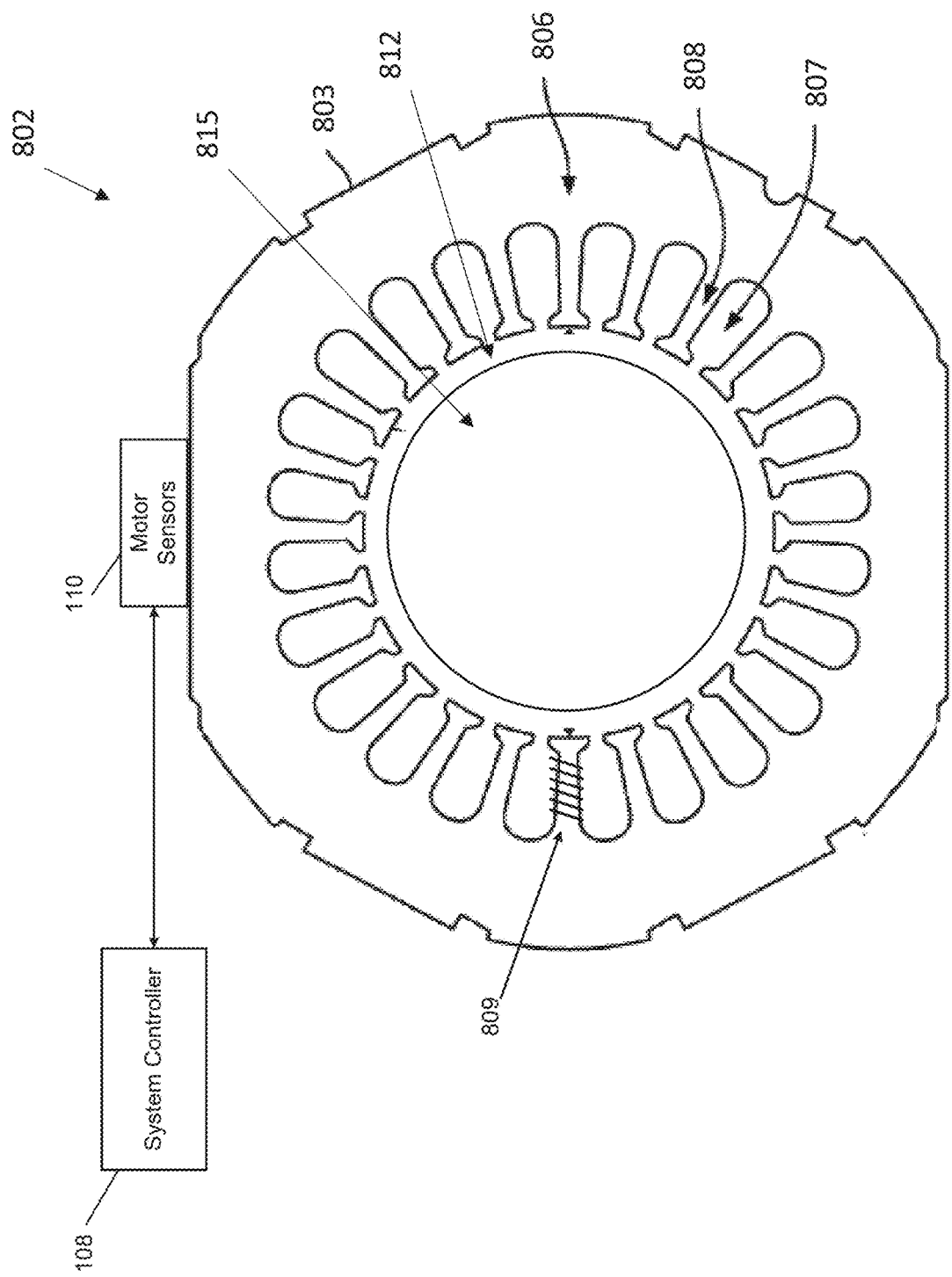
FIG. 8 is a diagram of an electric motor and windings of the electric motor.

FIG. 8 is a diagram of a motor according to an example embodiment, for which a machine learning model may be used to estimate a winding temperature of the motor. Although FIG. 8 illustrates an example arrangement of motor components, example embodiments are not limited thereto, and other example embodiments may use machine learning models to estimate winding temperature of other types of electric motors.

The motor 802 includes a stator core 803 having a stator yoke 806 and a plurality of teeth 808 extending from the stator yoke 806 toward a central opening 812. The central opening 812 extends from a first end of the stator core 803 to a second end of the stator core 803 opposite the first end. The plurality of teeth 808 are spaced apart from one another and define a plurality of slots 807 between the plurality of teeth 808.

The motor 802 further includes one or more windings 809 located within the plurality of slots 807 and wrapped around the plurality of teeth 808. For example, windings may include at least one main winding, at least one auxiliary winding, at least one start winding, etc. The windings may be coupled with a line terminal to receive power from a line voltage source (such as a utility power supply, a battery, etc.). FIG. 8 illustrates one set of windings 809 wrapped around one tooth 808 for purposes of illustration, but any suitable number of windings 809 may we wrapped around any suitable number of teeth 808, according to various motor winding patterns. One or more motor sensors 110 may be coupled with the motor 802, associated with motor 802, etc., to sense or detect operating parameters of the motor. The motor sensors 110 may communicate with the system controller 108 to provide sensed motor operating parameters to the system controller 108.

As shown in FIG. 8, the motor 802 includes a rotor body 815 located concentrically within the opening 812 of the stator core 803. The rotor body 815 includes an external surface that faces the stator core 803. The plurality of teeth 808 extend radially inward from the stator yoke 806. The plurality of teeth 808 define the boundaries of the winding slots 807 that are each located between adjacent teeth 808. Collectively, interior ends of the plurality of teeth 808 define the central opening 812 that receives the rotor body 815. Each slot 807 has a proximate end nearest the central opening 812, and a distal end radially distant from the central opening 812. Although the teeth 808 and the winding slots 807 are illustrated as being equally spaced circumferentially about the stator core 803, in other embodiments various other known teeth, slot and winding configurations may be used.

In various implementations, the windings may be formed by looping conducting wire including aluminum about the teeth 808. For example, the conducing wire may include aluminum, copper, etc., which may be insulated or non-insulated. The windings may have different sections that form one or more poles of the motor 802, and may be arranged in opposite slot pairs.

Although some example embodiments are described herein for using machine learning models to estimate winding temperature of windings of an electric motor, in other embodiments machine learning models may be trained to estimate winding temperature for any suitable electric machine, including machines having busbars, inverters (e.g., SiC dual inverters), etc. The machine learning models may be trained to estimate other operating conditions of an electric machine based on sensed machine operating parameters, such as a shaft torque estimation output indicative of a predicted torque of a shaft of the rotor, an insulated-gate bipolar transistor (IGBT) temperature estimation output indicative of a predicted temperature of an IGBT of the motor, etc.

In various implementations, a machine learning model may improve reliability of an electric machine by acting as a backup 'virtual' sensor that can estimate winding temperature when a physical sensor located within the winding fails, that can estimate winding temperature to supplement temperature readings from a physical sensor, etc. For example, the machine learning model may estimate a temperature of the windings without requiring an actual measurement of winding temperature or without using a physical temperature sensor in the windings of the motor (e.g., a "sensorless" model).

Using a machine learning model to estimate the winding temperature may avoid de-rated operation of the electric machine to maintain service life, and improve uptime of the electric machine. Some example embodiments may provide a reusable end-to-end framework, including one or more of a Simulink model, generation of synthetic data, use of Python for machine learning model implementations, pre-processing of input data, model training in Pytorch, deploying a model on a motor controller device, etc.

Figure 9:
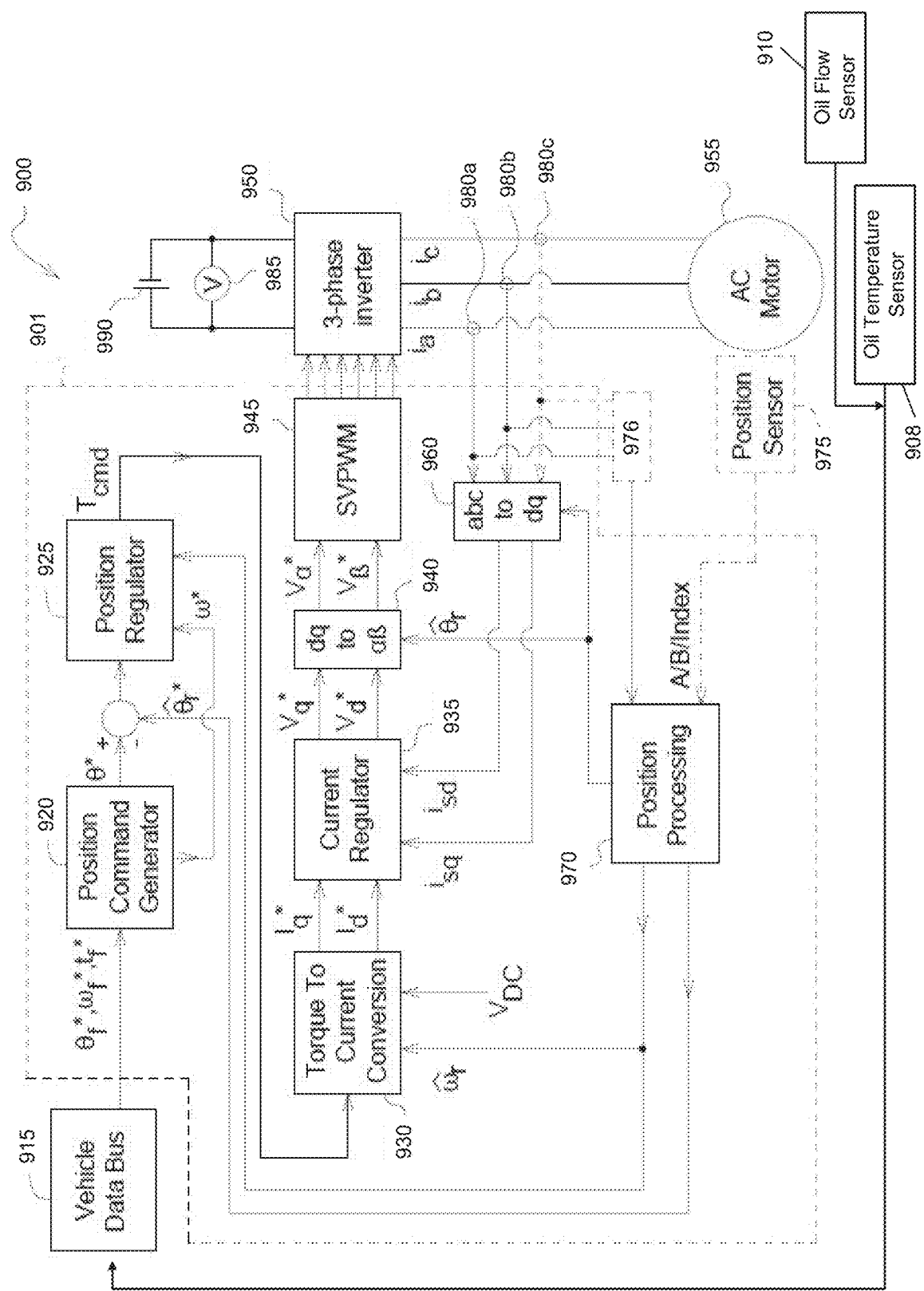
FIG. 9 illustrates a motor control and sensor arrangement according to at least one example embodiment In the drawings, reference numbers may be reused to identify similar and/or identical elements.

In accordance with an example embodiment, FIG. 9 illustrates a drive system 900 including a controller 901 for controlling a machine such as a motor 955, a position sensor 975, a three-phase inverter circuit 950, a voltage sensor 985, and a DC bus 990. The voltage sensor 985 measures a DC bus voltage $V_{DC}$ of the DC bus 990.

The motor controller 901 may have similar structure and functionality as the system controller of FIG. 1. For example, the motor controller 901 may implement a machine learning model to estimate a winding temperature of the motor 955 (e.g., using the machine learning model module 122). However, example embodiments are not limited thereto.

It should be understood that the drive system 900 may include additional features that are not illustrated in FIG. 9. For example, the drive system 900 may include a rotor magnet temperature estimation module, a current shaping module, and a terminal voltage feedback module. The features shown in FIG. 9 are illustrated for the convenience of describing the drive system 900 and it should be understood that the drive system 900 should not be limited to the features shown in FIG. 9.

The drive system 900 includes electronic modules, software modules, or both. In an example embodiment, the drive system 900 includes the motor controller 901 to support storing, processing or execution of software instructions of one or more software modules. The motor controller 901 is indicated by the dashed lines in FIG. 9.

The motor controller 901 is coupled to an inverter circuit 950. The inverter circuit 950 may be a three-phase inverter. The inverter circuit 950 includes a semiconductor drive circuit that drives or controls switching semiconductors (e.g., insulated gate bipolar transistors (IGBT) or other power transistors) to output control signals for the motor 955. In turn, the inverter circuit 950 is coupled to the motor 955. The motor 955 is associated with current transducers 980a and 980b. In some example embodiments, the motor 955 is associated with three current transducers 980a, 980b and 980c. In other example embodiments, the motor 955 is associated with the current transducers 980a and 980c or the current transducers 980b and 980c. It should be understood that the current transducers 980a, 980b and 980c may be another type of current sensor.

The current transducers 980 a and 980 b and the motor 955 are coupled to the motor controller 901 to provide feedback data (e.g., current feedback data, such as phase current values $i_a$ and $i_b$), raw position signals, among other possible feedback data or signals, for example. It should be understood that the drive system 900 may implement the three current transducers 980 a, 980 b and 980 c (or more or less current transducers).

The motor controller 901 includes a position command generator 920, a position regulator 925, a torque to current converter 930, a current regulator 935, a converter 940, a pulse width generation module 945, a converter 960 and a position processor 970.

While the position command generator 920, the position regulator 925, the torque to current converter 930, the current regulator 935, the converter 940, the pulse width generation module 945, the converter 960 and the position processor 970 are described as executing functions, it should be understood that a data processor, such as a digital signal processor or a microcontroller, is specifically programmed to execute the position command generator 920, the position regulator 925, the torque to current converter 930, the current regulator 935, the converter 940, the pulse width generation module 945, the converter 960 and the position processor 970. For example, a data processor may be specifically programmed to execute the position command generator 920, the position regulator 925, the torque to current converter 930, the current regulator 935, the converter 940, the pulse width generation module 945, the converter 960 and the position processor 970.

In at least some example embodiments, the hardware executing the functions of the motor controller 901, the position sensor 975, the inverter circuit 950 and the DC bus 990 may be on a same printed circuit board.

In an example embodiment, the position command generator 920 receives target value commands from a row unit controller (RUC) over the vehicle data bus 915. For example, the position command generator 920 receives a target time $t_f^*$, a target position $\theta_f^*$ and a target speed co; from the RUC. The target time $t$; indicates a desired time at which the rotor position of the motor should be at the target $\theta_f^*$ and the target speed $\omega_f^*$. The target speed $\omega_f^*$ is tied to vehicle speed of the row unit.

Based on the target time $t_f^*$, the target position $\theta_f^*$ and the target speed $\omega_f^*$, the position command generator 920 determines a position command $\theta^*$ and a speed command $\omega^*$ for the motor. The position regulator 925 receives input data representing a difference between an estimated position $\hat{\theta}_r$ and the position command $\theta^*$ as input.

The position regulator 925 converts the received input data into a torque command $T_{cmd}$. The torque command $T_{cmd}$ may be in Nm. The position regulator 925 determines a speed error (i.e., a difference between the speed command $\omega^*$ and the measured speed $\hat{\omega}_r$) and a position error (i.e., a difference between the position command $\theta^*$ and the estimated position $\hat{\theta}_r$). The position regulator 925 includes a proportional-integral-derivative (PID) controller. The PID uses the position error, the speed error, gains of the PID (e.g., integral gain, proportional gain and derivative gain) and a feedforward torque value to generate the torque command $T_{cmd}$. While the term command is used throughout the specification, it should be understood that command refers to a target value.

The torque to current converter 930 may be implemented as a look-up table in hardware and/or stored in memory (e.g., the memory 119 of FIG. 1). Using the torque command $T_{cmd}$, a DC bus voltage $v_{DC}$ and a measured electric rotor speed $\omega_r$ of the motor 955, the torque to current converter 930 generates q-d axis current commands $i_q^*$ and $i_d^*$ using MTPA (maximum torque per amp) and/or MTPV (maximum torque per volt) curves.

As shown in FIG. 9, the q-axis current command $i_q^*$ is output to the current regulator 935.

The current regulator 935 is capable of communicating with the pulse-width modulation (PWM) generation module 945 (e.g., space vector PWM generation module). The current regulator 935 receives respective d-q axis current commands (e.g., $i_d^*$ and $i_q^*$) and measured d-q axis stator currents (e.g., $i_{sq}$ and $i_{sd}$, where s refers to stator) and generates and outputs d-q axis voltage commands $v_d^*$ and $v_q^*$. It should be understood that the current regulator 935 may generate the d-q axis voltage commands (e.g., $v_d^*$ and $v_q^*$ commands) using any known method such as current feed forward compensation. In various implementations, d-axis voltage and current values, and q-axis voltage and current values, may be supplied as motor operating parameter inputs to a machine learning model (such as a model of the machine learning model module 122 of FIG. 1), to generate a winding temperature estimate for the motor 955.

The converter 940 receives the d-q axis voltage commands $v_d^*$ and $v_q^*$ and performs an inverse Park transformation to generate α-β axis voltage commands $v_\alpha^*$ and $v_\beta^*$. While at least one example embodiment is described using the α-β axis, it should be understood that example embodiments may be implemented using the d-q axis or three phase representation of a control vector.

In an example embodiment, the PWM generation module 945 converts the α axis voltage and β axis voltage data (voltage commands $v_\alpha^*$ and $v_\beta^*$) from two phase data representations into three phase representations (e.g., three phase voltage representations, such as va*, vb* and vc*) for control of the motor 955, for example. Outputs of the PWM generation module 945 are coupled to the inverter circuit 950.

The inverter circuit 950 includes power electronics, such as switching semiconductors to generate, modify and control pulse-width modulated signals or other alternating current signals (e.g., pulse, square wave, sinusoidal, or other waveforms) applied to the motor 955. The PWM generation module 945 provides inputs to a driver stage within the inverter circuit 950. An output stage of the inverter circuit 950 provides a pulse-width modulated voltage waveform or other voltage signal for control of the motor 955. In an example embodiment, the inverter circuit 950 is powered by the direct current (dc) voltage bus voltage $V_{DC}$.

The current transducers 980a, 980b measure two of three phase current data ia and ib, respectively, applied to the motor 955. It should be understood that an additional current transducer may also measure a third phase current data ic.

The converter 960 may apply a Clarke transformation or other conversion equations (e.g., certain conversion equations that are suitable and are known to those of ordinary skill in the art) to convert the measured three-phase representations of current into two-phase representations of current based on the current data ia and ib from the current transducers 980a, 980b and the estimated rotor position $\hat{\theta}_r$ from the position processor 970. The output of the converter 960 module ($i_{sq}$ and $i_{sd}$) is coupled to the current regulator 935.

As shown in FIG. 9, the position sensor 975 may be external to the motor controller 901.

More specifically, the position sensor 975 (e.g., a resolver, encoder, speed sensor, or another position sensor, speed sensors or algorithm) may determine the measured rotor position $\theta_r$. The position sensor 975 may be mounted on or integral with the rotor of the motor 955. In an example embodiment, the position sensor 975 may be coupled to an analog-to-digital converter (not shown) that converts analog raw position data or velocity data to digital raw position or velocity data, respectively. In other example embodiments, the sensor 975 (e.g., digital position encoder) may provide a digital data output of raw position data or velocity data for a shaft or rotor of the motor 955.

In at least one example embodiment, the position sensor 975 is an incremental encoder with an index that produces A/B digital pulses. The A/B are digital pulses that provide direction and a number of pulses (like 512 pulses each) per rotor revolution. Once per mechanical revolution the index line (Z) pulses to provide an absolute position.

The position processor 970 receives the output from the position sensor 975 and generates the estimated rotor position $\hat{\theta}_r$ and estimated/measured speed $\hat{\omega}_r$. In some example embodiments, a sensorless position estimator 976 may be used instead of the position sensor 975.

As shown in FIG. 9, an oil temperature sensor 908 and an oil flow sensor 910 may detect operating parameters of the motor 955, such as a temperature of oil in the motor 955 or supplied to the motor 955, a flow rate of oil to the motor 955 or a component of the motor such as the stator, etc. The oil temperature sensor 908 and the oil flow sensor 910 may provide output signals to the vehicle data bus 915 (e.g., a CAN bus), to allow the controller 901 to obtain oil temperature and flow rate parameter for providing input to a machine learning model. The CAN bus 915 may supply any other suitable parameters to the controller 901, and the controller 901 may implement a machine learning model on received/determined motor operating parameters to generate a winding temperature estimation for the motor 955.

Features of FIG. 9 are further described in U.S. application Ser. No. 16/898,902, the entire contents of which are incorporated by reference.

CONCLUSION

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. In the written description and claims, one or more steps within a method may be executed in a different order (or concurrently) without altering the principles of the present disclosure. Similarly, one or more instructions stored in a non-transitory computer-readable medium may be executed in different order (or concurrently) without altering the principles of the present disclosure. Unless indicated otherwise, numbering or other labeling of instructions or method steps is done for convenient reference, not to indicate a fixed order.

Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements.

The phrase "at least one of A, B, and C" should be construed to mean a logical (A OR B OR C), using a non-exclusive logical OR, and should not be construed to mean "at least one of A, at least one of B, and at least one of C." The term "set" does not necessarily exclude the empty set. The term "non-empty set" may be used to indicate exclusion of the empty set. The term "subset" does not necessarily require a proper subset. In other words, a first subset of a first set may be coextensive with (equal to) the first set.

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include processor hardware (shared, dedicated, or group) that executes code and memory hardware (shared, dedicated, or group) that stores code executed by the processor hardware.

The module may include one or more interface circuits. In some examples, the interface circuit(s) may implement wired or wireless interfaces that connect to a local area network (LAN) or a wireless personal area network (WPAN). Examples of a LAN are Institute of Electrical and Electronics Engineers (IEEE) Standard 802.11-2016 (also known as the WIFI wireless networking standard) and IEEE Standard 802.3-2015 (also known as the ETHERNET wired networking standard). Examples of a WPAN are IEEE Standard 802.15.4 (including the ZIGBEE standard from the ZigBee Alliance) and, from the Bluetooth Special Interest Group (SIG), the BLUETOOTH wireless networking standard (including Core Specification versions 3.0, 4.0, 4.1, 4.2, 5.0, and 5.1 from the Bluetooth SIG).

The module may communicate with other modules using the interface circuit(s). Although the module may be depicted in the present disclosure as logically communicating directly with other modules, in various implementations the module may actually communicate via a communications system. The communications system includes physical and/or virtual networking equipment such as hubs, switches, routers, and gateways. In some implementations, the communications system connects to or traverses a wide area network (WAN) such as the Internet. For example, the communications system may include multiple LANs connected to each other over the Internet or point-to-point leased lines using technologies including Multiprotocol Label Switching (MPLS) and virtual private networks (VPNs).

In various implementations, the functionality of the module may be distributed among multiple modules that are connected via the communications system. For example, multiple modules may implement the same functionality distributed by a load balancing system. In a further example, the functionality of the module may be split between a server (also known as remote, or cloud) module and a client (or, user) module. For example, the client module may include a native or web application executing on a client device and in network communication with the server module.

The term code, as used above, may include software, firmware, and/or microcode, and may refer to programs, routines, functions, classes, data structures, and/or objects. Shared processor hardware encompasses a single microprocessor that executes some or all code from multiple modules.

Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of a non-transitory computer-readable medium are nonvolatile memory devices (such as a flash memory device, an erasable programmable read-only memory device, or a mask read-only memory device), volatile memory devices (such as a static random access memory device or a dynamic random access memory device), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. Such apparatuses and methods may be described as computerized apparatuses and computerized methods. The functional blocks and flowchart elements described above serve as software specifications, which can be translated into the computer programs by the routine work of a skilled technician or programmer.

The computer programs include processor-executable instructions that are stored on at least one non-transitory computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Swift, Haskell, Go, SQL, R, Lisp, Java®, Fortran, Perl, Pascal, Curl, OCaml, JavaScript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A motor control system comprising:
   a motor including a plurality of windings;
   a first sensor configured to sense a first operating parameter of the motor;
   a second sensor configured to sense a second operating parameter of the motor;
   memory hardware configured to store a machine learning model and computer-executable instructions, the machine learning model trained to generate a winding temperature estimation output based on motor operating parameter inputs; and
   processor hardware configured to execute the instructions and use the machine learning model to cause the motor control system to,
      generate the winding temperature estimation output using the machine learning model based on the motor operating parameter inputs, the using the machine learning model including inputting an input feature vector to the machine learning model, the input feature vector derived from a combination of current parameter values of the first operating parameter and the second operating parameter and summarized historical parameter values, of the first operating parameter and the second operating parameter, over a specified time period, and the temperature estimation output indicative of a predicted temperature of the plurality of windings; and
      control the motor based on the winding temperature estimation output.

2. The motor control system of claim 1, wherein the processor hardware is further configured to execute the instructions and use the machine learning model to cause the motor control system to
   generate the winding temperature estimation output based on a plurality of motor operating parameters, the plurality of motor operating parameters including at least two of an oil inlet temperature, a rotor oil flow, a stator oil flow, a speed of the motor, a torque of the motor, a direct current (DC) bus voltage of the motor, a quadrature (q)-axis voltage of the motor, a direct (d)-axis voltage of the motor, a q-axis current of the motor or a d-axis current of the motor, the first operating parameter and the second operating parameter being part of the plurality of operating parameters.

3. The motor control system of claim 2, wherein the plurality of motor operating parameters does not include a sensed temperature of the motor or a sensed temperature of the plurality of windings.

4. The motor control system of claim 1, further comprising a temperature sensor configured to sense a temperature of the plurality of windings, wherein the instructions further include:
   using the sensed winding temperature from the temperature sensor to control operation of the motor when the temperature sensor has a normal operating condition; and
   using the winding temperature estimation output to control operation of the motor in response to a failure of the temperature sensor.

5. The motor control system of claim 1, wherein the processor hardware is configured to execute the instructions to cause the motor control system to
   compare the winding temperature estimation output of the machine learning model to a winding temperature threshold; and
   transmit an alarm signal in response to the winding temperature estimation output exceeding the winding temperature threshold.

6. The motor control system of claim 1, wherein the first sensor includes at least one of an oil temperature sensor, an oil flow sensor, a current sensor or a voltage sensor.

7. The motor control system of claim 1, wherein the machine learning model includes at least one of a feed forward network (FFN), a temporal convolution neural network (TCN), a convolution neural network, a long short-term memory (LSTM) network, an XGBoost model, a transformer model, a linear regression model, a decision tree model, a random forest model, a gradient boosting machine (GBM), a recurrent neural network (RNN) or a multilayer perceptron (MLP) model.

8. The motor control system of claim 7, wherein the machine learning model is the multilayer perceptron (MLP) model.

9. The motor control system of claim 1, the processor hardware is configured to execute the instructions to cause the motor control system to
determine a rolling mean of the first operating parameter over the specified time period; and
supply the determined rolling mean of the first operating parameter as an input to the machine learning model to generate the winding temperature estimation output.

10. The motor control system of claim 1, wherein the processor hardware is configured to execute the instructions to cause the motor control system to generate at least one of:
a shaft torque estimation output indicative of a predicted torque of at least one of a shaft or rotor of the motor; and
an insulated-gate bipolar transistor (IGBT) temperature estimation output indicative of a predicted temperature of an IGBT of the motor.

11. A computer system comprising:
memory hardware configured to store a machine learning model, motor operating parameter vector inputs, and computer-executable instructions, each motor operating parameter vector input including at least one operating parameter of a motor having a plurality of windings; and
processor hardware configured to execute the instructions, the instructions including:
training the machine learning model with the motor operating parameter vector inputs to generate a winding temperature estimation output, the winding temperature estimation output indicative of a predicted temperature of the plurality of windings based on a plurality of operating parameters of the motor;
obtaining a first operating parameter of the motor via a first sensor;
obtaining a second operating parameter of the motor via a second sensor;
supplying an input feature vector, based on the first operating parameter and the second operating parameter, as an input to the machine learning model to generate the winding temperature estimation output indicative of the predicted temperature of the plurality of windings, the input feature vector derived from a combination of current parameter values of the first operating parameter and the second operating parameter and summarized historical parameter values of the first operating parameter and the second operating parameter; and
executing at least one control instruction based on the winding temperature estimation output to control operation of the motor.

12. The computer system of claim 11, wherein the instructions further include generating synthetic data to define the motor operating parameter vector inputs for training the machine learning model, wherein generating the synthetic data includes:
generating timestamp data values for multiple motor operating parameters at multiple points of time within a specified time period;
scaling the timestamp data values to normalized input vector values; and
for each of the multiple motor operating parameters, determining at least one of a mean operating parameter, a standard deviation and a rolling average of the normalized input vector values corresponding to the motor operating parameter, wherein
the at least one of the mean, the standard deviation and the rolling average is determined within a specified time window size, and
a same specified time window size is applied to each of the multiple motor operating parameters.

13. The computer system of claim 11, wherein the machine learning model includes at least one of a feed forward network (FFN), a temporal convolution neural network (TCN), a convolution neural network, a long short-term memory (LSTM) network, an XGBoost model, a transformer model, a linear regression model, a decision tree model, a random forest model, a gradient boosting machine (GBM), a recurrent neural network (RNN) or a multilayer perceptron (MLP) model.

14. The computer system of claim 13, wherein the machine learning model is the multilayer perceptron (MLP) model.

15. The computer system of claim 11, wherein:
supplying inputs to the machine learning model includes supplying a plurality of motor operating parameters to the machine learning model including the first operating parameter and the second operating parameter; and
the plurality of operating parameters includes at least one of an oil inlet temperature, a rotor oil flow, a stator oil flow, a speed of the motor, a torque of the motor, a direct current (DC) bus voltage of the motor, a q-axis voltage of the motor, a d-axis voltage of the motor, a q-axis current of the motor or a d-axis current of the motor.

16. The computer system of claim 15, wherein the plurality of motor operating parameters does not include a sensed temperature of the motor or a sensed temperature of the plurality of windings.

17. The computer system of claim 11, wherein:
the instructions further include determining a rolling mean of the first operating parameter over a specified time period; and
supplying the inputs to the machine learning model includes supplying the determined rolling mean of the first operating parameter as an input to the machine learning model to generate the winding temperature estimation output.

18. The computer system of claim 11, wherein executing the control instruction includes:
comparing the winding temperature estimation output of the machine learning model to a winding temperature threshold; and
transmitting an alarm signal in response to the winding temperature estimation output exceeding the winding temperature threshold.

19. The computer system of claim 11, wherein the supplying the first operating parameter and the second operating parameter as inputs to the machine learning model generates at least one of:

a shaft torque estimation output indicative of a predicted torque of at least one of a shaft or rotor of the motor; and an insulated-gate bipolar transistor (IGBT) temperature estimation output indicative of a predicted temperature of an IGBT of the motor.

20. A computerized method comprising:

obtaining motor operating parameter vector inputs, each motor operating parameter vector input including at least one operating parameter of a motor having a stator, a rotor, and a plurality of windings, the rotor configured to rotate relative to the stator, and the plurality of windings wound about a portion of at least one of the stator and the rotor;

training a machine learning model with the motor operating parameter vector inputs to generate a winding temperature estimation output, the winding temperature estimation output indicative of a predicted temperature of the plurality of windings based on a plurality of operating parameters of the motor;

obtaining a first operating parameter of the motor via a first sensor;

obtaining a second operating parameter of the motor via a second sensor;

supplying an input feature vector to the machine learning model to generate the winding temperature estimation output indicative of the predicted temperature of the plurality of windings, the input feature vector derived from a combination of current parameter values of the first operating parameter and the second operating parameter and summarized historical parameter values of the first operating parameter and the second operating parameter; and executing at least one control instruction based on the winding temperature estimation output to control operation of the motor.

* * * * *